US012176239B2

(12) United States Patent
Marinov et al.

(10) Patent No.: US 12,176,239 B2
(45) Date of Patent: Dec. 24, 2024

(54) PARALLEL ASSEMBLY OF DISCRETE COMPONENTS ONTO A SUBSTRATE

(71) Applicant: KULICKE & SOFFA NETHERLANDS B.V., Eindhoven (NL)

(72) Inventors: Val Marinov, Fargo, ND (US); Ronn Kliger, Cambridge, MA (US); Matthew R. Semler, Fargo, ND (US)

(73) Assignee: KULICKE & SOFFA NETHERLANDS B.V., Eindhoven (NL)

( * ) Notice: Subject to any disclaimer, the term of this patent is extended or adjusted under 35 U.S.C. 154(b) by 0 days.

(21) Appl. No.: 18/478,597

(22) Filed: Sep. 29, 2023

(65) Prior Publication Data

US 2024/0105491 A1 Mar. 28, 2024

Related U.S. Application Data

(63) Continuation of application No. 17/526,534, filed on Nov. 15, 2021, now Pat. No. 11,804,397, which is a
(Continued)

(51) Int. Cl.
*H01L 21/683* (2006.01)
*B23K 26/067* (2006.01)
(Continued)

(52) U.S. Cl.
CPC ...... *H01L 21/6836* (2013.01); *B23K 26/0673* (2013.01); *B23K 26/354* (2015.10);
(Continued)

(58) Field of Classification Search
CPC ............... H01L 33/0095; H01L 33/50; H01L 2221/68327; H01L 2221/68363;
(Continued)

(56) References Cited

U.S. PATENT DOCUMENTS

| 4,964,698 A | 10/1990 | Rowlette |
| 5,373,137 A | 12/1994 | McLaughlin |

(Continued)

FOREIGN PATENT DOCUMENTS

| CN | 101859728 | 10/2010 |
| CN | 103597589 | 2/2014 |

(Continued)

OTHER PUBLICATIONS

Extended European Search Report in European Application No. 18817530.1, dated Dec. 17, 2020, 14 pages.
(Continued)

*Primary Examiner* — Vu A Vu
(74) *Attorney, Agent, or Firm* — Fish & Richardson P.C.

(57) ABSTRACT

A method includes transferring multiple discrete components from a first substrate to a second substrate, including illuminating multiple regions on a top surface of a dynamic release layer, the dynamic release layer adhering the multiple discrete components to the first substrate, each of the irradiated regions being aligned with a corresponding one of the discrete components. The illuminating induces a plastic deformation in each of the irradiated regions of the dynamic release layer. The plastic deformation causes at least some of the discrete components to be concurrently released from the first substrate.

20 Claims, 12 Drawing Sheets

Related U.S. Application Data continuation of application No. 16/621,432, filed as application No. PCT/US2018/029347 on Apr. 25, 2018, now Pat. No. 11,201,077.

(60) Provisional application No. 62/518,270, filed on Jun. 12, 2017.

(51) Int. Cl.

| | | |
|---|---|---|
| *B23K 26/354* | (2014.01) | |
| *B23K 26/36* | (2014.01) | |
| *H01L 21/67* | (2006.01) | |
| *H01L 25/075* | (2006.01) | |
| *H01L 33/62* | (2010.01) | |
| *G02B 27/10* | (2006.01) | |
| *H01L 33/00* | (2010.01) | |
| *H01L 33/50* | (2010.01) | |

(52) U.S. Cl.
CPC ........ *B23K 26/36* (2013.01); *H01L 21/67115* (2013.01); *H01L 25/0753* (2013.01); *H01L 33/62* (2013.01); *G02B 27/1086* (2013.01); *H01L 33/0095* (2013.01); *H01L 33/50* (2013.01); *H01L 2221/68327* (2013.01); *H01L 2221/68363* (2013.01); *H01L 2221/68381* (2013.01); *H01L 2933/0066* (2013.01)

(58) Field of Classification Search
CPC ... H01L 2221/68381; H01L 2933/0066; H01L 2221/68368; H01L 21/6835; H01L 2221/68322; H01L 2221/68354; H01L 2224/04105; H01L 2224/24137; H01L 2224/32225; H01L 2224/73267; H01L 2224/95; H01L 2924/15153; H01L 2924/12041; H01L 21/02; H01L 21/56; H01L 21/67092; H01L 21/67121; H01L 21/67144; H01L 21/67259; H01L 21/67712; H01L 21/67721; H01L 21/68; H01L 25/075; H01L 21/6836; H01L 21/67115; H01L 25/0753; H01L 33/62; B23K 26/38; B23K 26/354; B23K 26/0673; B23K 26/36; G02B 27/1086

USPC .......................................................... 438/28
See application file for complete search history.

(56) References Cited

U.S. PATENT DOCUMENTS

| | | | |
|---|---|---|---|
| 6,605,799 B2 | 8/2003 | Brandinger et al. | |
| 6,625,181 B1 | 9/2003 | Oshemkov et al. | |
| 6,693,656 B1 | 2/2004 | Koide | |
| 6,872,635 B2 | 3/2005 | Hayashi et al. | |
| 7,015,055 B2 | 3/2006 | Oohata et al. | |
| 7,364,983 B2 | 4/2008 | Wang et al. | |
| 7,916,270 B2 * | 3/2011 | Nagasaka | G03F 7/70716 355/72 |
| 8,056,222 B2 | 11/2011 | Pique et al. | |
| 8,361,268 B2 | 1/2013 | Mizuno et al. | |
| 8,585,253 B2 * | 11/2013 | Duong | C09K 11/0883 362/244 |
| 8,884,327 B2 * | 11/2014 | Sugizaki | H01L 33/38 257/E33.056 |
| 9,093,620 B2 * | 7/2015 | Ikegami | H01L 33/505 |
| 9,366,872 B2 * | 6/2016 | Honea | G02B 27/30 |
| 9,406,644 B2 | 8/2016 | Uhm et al. | |
| 9,496,155 B2 | 11/2016 | Menard et al. | |
| 9,516,732 B2 * | 12/2016 | Wagner | G03F 7/70025 |
| 9,534,981 B2 * | 1/2017 | Roussev | G01L 1/248 |
| 9,644,234 B2 * | 5/2017 | Pipper | H05B 3/0038 |
| 9,829,310 B2 * | 11/2017 | Bean | G01B 9/02044 |
| 9,841,378 B2 * | 12/2017 | Thrush | G01N 21/6456 |
| 10,032,827 B2 | 6/2018 | Zhu et al. | |
| 10,070,568 B2 | 9/2018 | Pourchet | |
| 10,096,740 B1 | 10/2018 | Chen | |
| 10,254,252 B2 * | 4/2019 | Yacoubian | G01N 21/171 |
| 10,460,971 B2 | 10/2019 | Horibe | |
| 10,578,982 B2 * | 3/2020 | Van Der Laan | G03F 7/70675 |
| 10,607,873 B2 * | 3/2020 | Janda | G03F 9/7092 |
| 10,770,620 B2 | 9/2020 | Chen et al. | |
| 10,790,173 B2 | 9/2020 | Gomez et al. | |
| 10,923,641 B2 | 2/2021 | Hsieh | |
| 11,201,077 B2 | 12/2021 | Marinov et al. | |
| 11,424,396 B2 * | 8/2022 | Saputra | H01L 33/50 |
| 11,804,397 B2 | 10/2023 | Marinov et al. | |
| 2003/0010762 A1 | 1/2003 | Koide | |
| 2003/0168434 A1 | 9/2003 | Gross et al. | |
| 2006/0264004 A1 | 11/2006 | Tong et al. | |
| 2007/0075063 A1 | 4/2007 | Wilbanks et al. | |
| 2008/0047939 A1 | 2/2008 | Hummelt | |
| 2008/0210368 A1 | 9/2008 | Zakel et al. | |
| 2010/0258543 A1 | 10/2010 | Mizuno et al. | |
| 2010/0326702 A1 | 12/2010 | Dang et al. | |
| 2011/0049545 A1 * | 3/2011 | Basin | H01L 24/97 257/E33.061 |
| 2013/0273695 A1 | 10/2013 | Menard et al. | |
| 2014/0160452 A1 | 6/2014 | De Jager et al. | |
| 2014/0238592 A1 | 8/2014 | Marinov et al. | |
| 2015/0371874 A1 | 12/2015 | Bower et al. | |
| 2016/0240516 A1 | 8/2016 | Chang | |
| 2017/0077281 A1 | 3/2017 | Jun et al. | |
| 2017/0142874 A1 | 5/2017 | Pourchet et al. | |
| 2017/0301660 A1 | 10/2017 | Pokhriyal et al. | |
| 2017/0365499 A1 | 12/2017 | Marinov | |
| 2019/0027662 A1 * | 1/2019 | Saputra | H01L 33/46 |
| 2019/0057891 A1 | 2/2019 | Marinov et al. | |
| 2019/0276308 A1 | 9/2019 | Hsu et al. | |
| 2020/0168498 A1 | 5/2020 | Marinov et al. | |
| 2022/0076983 A1 | 3/2022 | Marinov et al. | |

FOREIGN PATENT DOCUMENTS

| | | |
|---|---|---|
| CN | 105050764 | 11/2015 |
| CN | 2016111373620 | 12/2016 |
| JP | 2002366054 | 12/2002 |
| JP | 2004319538 | 11/2004 |
| JP | 2005159311 | 6/2005 |
| JP | 2005174979 | 6/2005 |
| JP | 2006041500 | 2/2006 |
| JP | 2008521238 | 6/2008 |
| JP | 2010251359 | 11/2010 |
| JP | 2014515883 | 7/2014 |
| JP | 2014526146 | 10/2014 |
| JP | 2015119085 | 6/2015 |
| JP | 2016523710 | 8/2016 |
| JP | 2018536987 | 12/2018 |
| KR | 20130052947 | 5/2013 |
| KR | 20140045936 | 4/2014 |
| KR | 20140098546 | 8/2014 |
| KR | 20150119149 | 10/2015 |
| KR | 201501119149 | 10/2015 |
| KR | 20150131389 | 11/2015 |
| KR | 20170060043 | 5/2017 |
| KR | 20170096127 | 8/2017 |
| KR | 20190000886 | 1/2019 |
| TW | 201023337 | 6/2010 |
| TW | 201113940 | 4/2011 |
| TW | 201426920 | 7/2014 |
| TW | 201445648 | 12/2014 |
| TW | 201613068 | 4/2016 |
| TW | 201631703 | 9/2016 |
| TW | 201838142 | 10/2018 |
| WO | WO2006054233 | 5/2006 |
| WO | WO2009102002 | 8/2009 |
| WO | WO2013145071 | 10/2013 |
| WO | WO2016100657 | 6/2016 |
| WO | WO2017075776 | 5/2017 |
| WO | WO2017123780 | 7/2017 |

(56) References Cited

FOREIGN PATENT DOCUMENTS

OTHER PUBLICATIONS

Notice of Allowance in Japanese Application No. 2020-104524, dated Jul. 25, 2022, 5 pages (with English Translation).
Notice of Allowance in Korean Application No. 10-2020-7027175, dated Jun. 14, 2022, 8 pages (with English Translation).
Notice of Reasons for Refusal in Japanese Application No. 2018-553154, dated Dec. 9, 2019, 14 pages with English Translation.
Notice of Reasons for Refusal in Japanese Application No. 2020-104524, dated Sep. 13, 2021, 8 pages with English Translation.
Office Action in Chinese Application No. 201880002383.2, dated Feb. 13, 2023, 23 pages (with English Translation).
Office Action in Chinese Application No. 201880002383.2, dated May 19, 2022, 22 pages (with English Translation).
Office Action in Chinese Application No. 201880002383.2, dated Sep. 20, 2023, 21 pages (with English Translation).
Office Action in Japanese Application No. 2022-133276, dated Nov. 20, 2023, 9 pages (with English Translation).
Office Action in Korean Application No. 10-2018-7032338, dated Feb. 5, 2020, 33 pages with English translation.
Office Action in Korean Application No. 10-2020-7027175, dated Jan. 19, 2022, 20 pages with English Translation.
Office Action in Korean Application No. 10-2020-7027175, dated May 7, 2021, 13 pages with English Translation.
Office Action in Korean Application No. 10-2022-7031989, dated May 11, 2023, 15 pages (with English Translation).
Office Action in Taiwanese Application No. 107120190, dated Dec. 27, 2019, 18 pages with English translation.
Office Action in Taiwanese Application No. 110107322, dated Jul. 30, 2021, 16 pages with English Translation.
Office Action in Taiwanese Application No. 111121260, dated Dec. 14, 2022, 17 pages (with English Translation).
PCT International Preliminary Report on Patentability in International Application No. PCT/US2018/029347, dated Dec. 17, 2019, 10 pages.
PCT International Search Report and Written Opinion in International Application No. PCT/US2018/29347, dated Aug. 31, 2018. 17 pages.
PCT Invitation to Pay Additional Fees in International Application No. PCT/US2018/29347, dated Apr. 25, 2018, 2 pages.
Notice of Allowance in Korean Application No. 10-2022-7031989, dated May 9, 2024, 8 pages (with English Translation).
Office Action in Japanese Application No. 2022-133276, dated Jul. 1, 2024, 9 pages (with English Translation).

\* cited by examiner

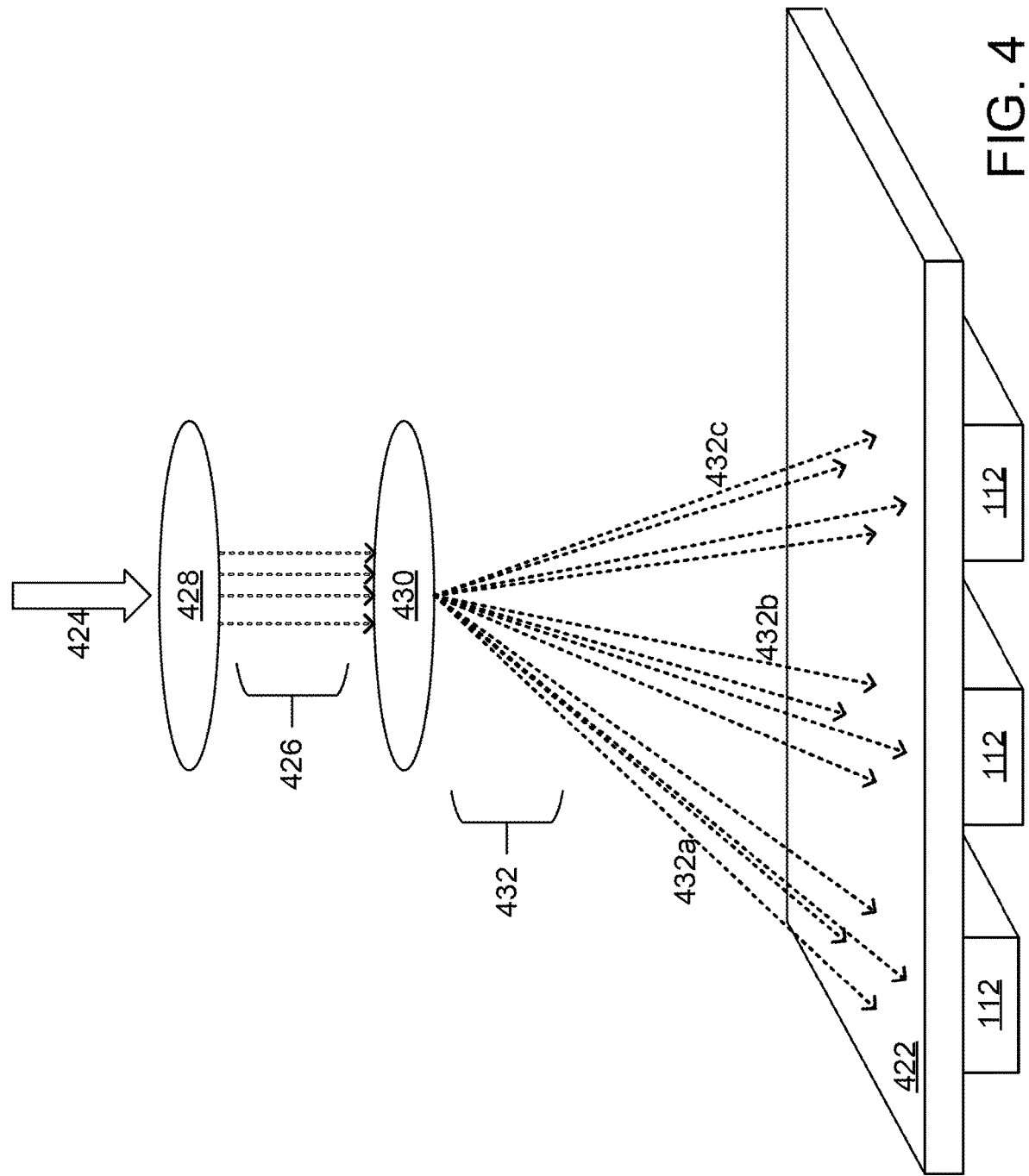

PARALLEL ASSEMBLY OF DISCRETE COMPONENTS ONTO A SUBSTRATE

CLAIM OF PRIORITY

This application is a continuation of U.S. application Ser. No. 17/526,534 filed Nov. 15 2021, which is a continuation of U.S. application Ser. No. 16/621,432, filed on Dec. 11, 2019 (now U.S. Pat. No. 11,201,077), which is a 371 application of PCT/US2018/029347, filed on Apr. 25, 2018, and claims priority to U.S. Patent Application Ser. No. 62/518,270, filed on Jun. 12, 2017, the contents of which are incorporated here by reference in their entirety.

BACKGROUND

This description relates generally to assembling discrete components onto a substrate.

SUMMARY

In an aspect, a method includes transferring multiple discrete components from a first substrate to a second substrate, including concurrently irradiating multiple regions on a top surface of a dynamic release layer, the dynamic release layer adhering the multiple discrete components to the first substrate, each of the irradiated regions being aligned with a corresponding one of the discrete components. The irradiating induces an ablation of at least a portion of the dynamic release layer in each of the irradiated regions. The ablation causes at least some of the discrete components to be concurrently released from the first substrate.

Embodiments can include one or more of the following features.

Irradiating the multiple regions includes irradiating the multiple regions with laser energy. The method includes separating the laser energy into multiple beamlets, and irradiating each of the multiple regions with one of the beamlets of laser energy. The method includes separating the laser energy with a diffractive optical element. The irradiating induces ablation of a partial thickness of the dynamic release layer in each of the irradiated regions. The ablation of the partial thickness of the dynamic release layer induces a deformation of a remaining thickness of the dynamic release layer in each of the irradiated regions. The deformation includes a blister in each of the irradiated regions of the dynamic release layer, the blisters each exerting a force on the corresponding discrete component. The force exerted by the blisters causes the discrete components to be released from the first substrate. The ablation of the partial thickness induces a plastic deformation in each of the irradiated regions. The ablation of the partial thickness induces an elastic deformation in each of the irradiated regions. The irradiating induces ablation of an entire thickness of the dynamic release layer in each of the irradiated regions. The method includes reducing an adhesion of the dynamic release layer prior to irradiating the multiple regions. Reducing an adhesion of the dynamic release layer includes exposing the dynamic release layer to a stimulus. Exposing the dynamic release layer to a stimulus includes exposing the dynamic release layer to one or more of heat and ultraviolet light. Transferring the multiple discrete components includes transferring a first set of one or more discrete components to a first target substrate, the discrete components in the first set sharing a first common characteristic; and transferring a second set of one or more discrete components to a second target substrate, the discrete components in the second set sharing a second common characteristic. The discrete components include light emitting diodes (LEDs), and in which the characteristic includes one or more of an optical characteristic and an electrical characteristic. Transferring the multiple discrete components to the second substrate includes transferring fewer than all of the discrete components from the first substrate to the second substrate. The method includes, before transferring the multiple discrete components, transferring each of one or more of the discrete components individually from the first substrate to a destination. Transferring each of one or more of the discrete components individually includes transferring the discrete components that do not satisfy a quality criterion. The method includes, after transferring the multiple discrete components to the second substrate, transferring each of one or more discrete components that remain on the first substrate individually to the second substrate. The method includes, after transferring the multiple discrete components to the second substrate, transferring each of one or more discrete components from a third substrate individually to the second substrate. The multiple discrete components form an array of discrete components on the second substrate, and in which transferring each of one or more discrete components that remain on the first substrate includes transferring a discrete component to an empty position in the array on the second substrate. Irradiating multiple regions includes scanning the irradiation to multiple subsets of discrete components. The multiple discrete components in each subset are released concurrently, and the multiple subsets are released successively. Irradiating multiple regions includes irradiating each region with an irradiation pattern. The method includes separating laser energy into the irradiation pattern. The method includes separating the laser energy into the irradiation pattern with a first diffractive optical element. The method includes separating the irradiation pattern into multiple beamlets of laser energy, each beamlet having the irradiation pattern. The method includes separating the irradiation pattern into multiple beamlets with a second diffractive optical element. The method includes scanning the multiple beamlets of laser energy, each having the irradiation pattern, to multiple subsets of discrete components. The method includes separating laser energy into multiple beamlets of laser energy, each beamlet having the irradiation pattern, with a single diffractive optical element. The irradiation pattern includes multiple beamlets of laser energy, each beamlet corresponding to a particular location on a given discrete component. The irradiation pattern includes four beamlets of laser energy, each beamlet corresponding to a corner of a given discrete component. Transferring the multiple discrete components from the first substrate to the second substrate includes transferring the multiple discrete components to the second substrate in a face-down orientation. The multiple discrete components include light emitting diodes (LEDs).

In an aspect, an apparatus includes a substrate assembly, including a substrate, a dynamic release layer disposed on a surface of the substrate, and multiple discrete components adhered to the substrate by the dynamic release layer; and an optical system including at least one optical element configured to separate a laser beam from a source of laser energy into multiple beamlets, each beamlet configured to illuminate a corresponding region on a top surface of the dynamic release layer.

Embodiments can include one or more of the following features.

The at least one optical element is configured to separate the laser beam from the source into the multiple beamlets, each beamlet having an irradiation pattern. The irradiation pattern includes multiple beamlets of laser energy, each beamlet of the irradiation pattern configured to illuminate a particular location on a given discrete component. The optical system includes a first optical element configured to separate the laser beam from the source into the irradiation pattern; and a second optical element configured to separate the irradiation pattern into the multiple beamlets, each beamlet having the irradiation pattern. The first and second optical elements each include a diffractive optical element. The optical system includes a first optical element configured to separate the laser beam from the source into the multiple beamlets; and a second optical element configured to separate each of the multiple beamlets into the irradiation pattern. The apparatus includes a scanning mechanism configured to scan the multiple beamlets of laser energy to multiple regions of the dynamic release layer, each region of the dynamic release layer adhering a subset of the multiple discrete components to the substrate. The optical system has (i) a first configuration in which the optical element is in the path of the laser beam between the source of laser energy and the dynamic release layer and (ii) a second configuration in which the optical element is not in the path of the laser beam between the source of laser energy and the dynamic release layer. When the optical system is in the first configuration, the optical element separates the laser beam into the multiple beamlets. When the optical system is in the second configuration, the laser beam is incident on the top surface of the dynamic release layer at a location corresponding to a location of one of the discrete components. The apparatus includes a controller configured to control the alignment of the laser beam with the location of the one of the discrete components. The controller is configured to control the alignment of the laser beam based on information indicative of one or more of a characteristic and a quality of each of one or more of the discrete components. The optical system includes a first optical element configured to separate the laser beam into a first number of beamlets; a second optical element configured to separate the laser beam into a second number of beamlets; and a switching mechanism configured to position the first optical element or the second optical element in the path of the laser beam. The apparatus includes the source of laser energy. The source of laser energy includes a laser. The irradiation of the regions of the dynamic release layer causes release of the discrete components aligned with the irradiated regions. One or more of a wavelength and fluence of each beamlet of the laser energy is sufficient to induce an ablation of at least a partial thickness of the dynamic release layer in each of the irradiated regions. The wavelength or fluence of each beamlet is sufficient to induce an ablation of a partial thickness of the dynamic release layer in each of the irradiated regions, the ablation of the partial thickness inducing a deformation in each of the irradiated regions. The wavelength or fluence of each beamlet is sufficient to induce an ablation of an entire thickness of the dynamic release layer in each of the irradiated regions. An adhesion of the dynamic release layer is responsive to a stimulus. The adhesion of the dynamic release layer is responsive to one or more of heat and ultraviolet light. The discrete components include LEDs.

In an aspect, an apparatus includes a source of laser energy; a substrate holder configured to receive a substrate; an optical system including a first optical element configured to separate a laser beam from the source of laser energy into multiple beamlets, in which the optical system has a first configuration in which the first optical element is disposed in the path of laser energy between the source of laser energy and the substrate holder and at least one second configuration, the at least one second configuration being one or more of (i) a configuration in which a second optical element is disposed in the path of the laser energy and (ii) a configuration in which neither the first optical element nor the second optical element is in the path of laser energy; and a controller configured to control the configuration of the optical system.

Embodiments can include one or more of the following features.

The apparatus includes a scanning device configured to scan the laser beam or beamlets output from the optical system relative to the substrate holder. The controller is configured to move the first optical element into and out of the path of the laser energy. The apparatus includes a stimulus application device configured to output a stimulus including one or more of ultraviolet light and heat. When a substrate is present in the substrate holder, the stimulus application device is positioned to apply the stimulus to the substrate.

In an aspect, an apparatus includes a source of laser energy; a first substrate holder configured to receive at least one first substrate; an optical system including a first optical element configured to separate a laser beam from the source of laser energy into multiple beamlets, in which the optical system has a first configuration in which the first optical element is disposed in the path of laser energy between the source of laser energy and the first substrate holder and at least one second configuration, the at least one second configuration being one or more of (i) a configuration in which a second optical element is disposed in the path of the laser energy and (ii) a configuration in which neither the first optical element nor the second optical element is in the path of laser energy; a first controller configured to control the configuration of the optical system; a second substrate holder configured to hold at least one second substrate, at least a portion of the second substrate holder being disposed below the first substrate holder; and a second controller configured to control the positioning of the second substrate holder relative to the first substrate holder. The apparatus includes a scanning device configured to scan the laser beam or beamlets output from the optical system relative to the substrate holder. The apparatus includes a stimulus application device configured to output a stimulus including one or more of ultraviolet light and heat. The apparatus includes a control system, the control system including the first controller and the second controller. The second substrate holder is configured to hold multiple second substrates. The apparatus includes a substrate rack configured to hold multiple second substrates; and a transfer mechanism controllable by the second controller to transfer one of the multiple second substrates from the substrate rack to the second substrate holder. The first substrate holder is configured to hold multiple first substrates. The apparatus includes a substrate rack configured to hold multiple first substrates; and a transfer mechanism controllable by a third controller to transfer one of the multiple first substrates from the substrate rack to the first substrate holder.

In an aspect, a method includes transferring multiple discrete components from a substrate, the discrete components being adhered to the substrate by a dynamic release layer, the transferring including individually transferring each of one or more first discrete components from the substrate to a first destination using a first laser-assisted transfer process, the first discrete components not satisfying a quality criterion; and transferring multiple second discrete components from the substrate to a second destination using a second laser-assisted transfer process, the second discrete components satisfying the quality criterion.

Embodiments can include one or more of the following features.

Transferring multiple second discrete components includes transferring fewer than all of the second discrete components such that one or more second discrete components remain adhered to the substrate. The method includes individually transferring each of one or more of the second discrete components that remain adhered to the substrate to the second destination. The multiple second discrete components form an array of discrete components at the second destination, and in which individually transferring each of one or more of the second discrete components that remain includes transferring each of the remaining second discrete components to an empty position in the array. The second laser-assisted transfer process includes irradiating multiple regions on a top surface of the dynamic release layer, each of the irradiated regions being aligned with a corresponding one of the second discrete components, in which the irradiation causes the second discrete components to be concurrently released from the substrate. The first laser-assisted transfer process includes, for each of the first discrete components irradiating a region on a top surface of the dynamic release layer, the region being aligned with the first discrete component, in which the irradiation causes the first discrete component to be released from the substrate. The method includes reducing an adhesion of the dynamic release layer prior to transferring the one or more first discrete components. Reducing an adhesion of the dynamic release layer includes exposing the dynamic release layer to one or more of heat and ultraviolet light. The second destination includes a target substrate, and in which transferring the multiple second discrete components to the second destination includes transferring the second discrete components set onto an attachment element disposed on a top surface of the target substrate. The method includes curing the attachment element to bond the transferred second discrete components to the target substrate. Curing the attachment element includes exposing the attachment element to one or more of heat, ultraviolet light, and mechanical pressure. The method includes applying the attachment element to the target substrate. The second destination includes a target substrate, and including bonding the transferred second discrete components to the target substrate. The second destination includes a target substrate having circuit components, and in which the method includes interconnecting circuit components of the transferred second discrete components to the circuit components of the target substrate. The method includes transferring the discrete components from a donor substrate to the substrate. Transferring the discrete components from the donor substrate to the substrate includes contacting the dynamic release layer on the substrate to the discrete components on the donor substrate. The method includes singulating the discrete components on the donor substrate. The donor substrate includes a dicing tape. The donor substrate includes a wafer. The method includes applying the dynamic release layer to the substrate.

In an aspect, a method includes transferring discrete components from a carrier substrate to each of multiple target substrates, the discrete components being adhered to the carrier substrate by a dynamic release layer, the transferring including using a laser-assisted transfer process, transferring a first set of the discrete components to a first target substrate using a laser-assisted transfer process, the discrete components in the first set sharing a first characteristic; and using the laser-assisted transfer process, transferring a second set of the discrete components to a second target substrate, the discrete components in the second set sharing a second characteristic different from the first characteristic.

Embodiments can include one or more of the following features.

The method includes transferring the discrete components from multiple carrier substrates to the multiple target substrates. The method includes transferring the discrete components consecutively from each of the multiple carrier substrates. The transferring includes transferring discrete components from a first carrier substrate to one or more of the target substrates in a transfer system; removing the first carrier substrate from a transfer position in the transfer system; placing a second carrier substrate in the transfer position; and transferring discrete components from the second carrier substrate to one or more of the target substrates. The transferring includes transferring the first set of discrete components to the first target substrate in a transfer system; removing the first target substrate from a transfer position in the transfer system; and placing the second target substrate in the transfer position for transfer of the second set of discrete components. The discrete components include LEDs, and in which the first and second characteristics include one or more of an optical characteristic and an electrical characteristic. Transferring each set of the discrete components to the corresponding target substrate includes transferring each of the discrete components in the set individually to the target substrate. Transferring each set of discrete components to the corresponding target substrate includes concurrently transferring some or all of the discrete components in the set to the target substrate. Transferring a set of discrete components to the corresponding target substrate includes transferring the discrete components in the set onto a layer of die catching material disposed on a top surface of the target substrate. The method includes applying the die receiving material to each target substrate. The method includes reducing an adhesion of the dynamic release layer. Reducing an adhesion of the dynamic release layer includes exposing the dynamic release layer to one or more of heat and ultraviolet light. The method includes transferring the discrete components from a donor substrate to the carrier substrate. Transferring the discrete components from the donor substrate to the carrier substrate includes contacting the dynamic release layer on the carrier substrate to the discrete components on the donor substrate. The donor substrate includes a dicing tape. The donor substrate includes a wafer. The method includes applying the dynamic release layer to the carrier substrate.

In an aspect, an apparatus includes a substrate, multiple pockets being formed in a top surface of the substrate; spectrum shifting material disposed in each of the multiple pockets, the spectrum shifting material configured to emit light at one or more emission wavelengths responsive to absorbing light at an excitation wavelength; and a LED disposed in each of the multiple pockets, each LED configured to emit light at the excitation wavelength, each LED oriented such that light emitted from the micro-LED illuminates the spectrum shifting material disposed in the corresponding pocket.

Embodiments can include one or more of the following features.

The spectrum shifting material includes a first spectrum shifting material configured to emit light at a first emission wavelength; and a second spectrum shifting material configured to emit light at a second emission wavelength. The first spectrum shifting material is disposed in a first subset of the multiple pockets and the second spectrum shifting material is disposed in a second subset of the multiple pockets. The pockets are arranged in a two-dimensional array, and in which the first spectrum shifting material is disposed in pockets in first rows of the array and the second spectrum shifting material is disposed in pockets in second rows of the array. The spectrum shifting material includes a third spectrum shifting material configured to emit light at a third emission wavelength, and in which the first emission wavelength corresponds to red light, the second emission wavelength corresponds to green light, and the third emission wavelength corresponds to blue light. The LEDs are oriented such that a light-emitting face of each LED faces away from the top surface of the substrate. Each LED includes contacts formed on a second face of the LED, the second face opposite the light-emitting face. The apparatus includes electrical connection lines in electrical contact with the contacts of the LEDs. The substrate is transparent to light at the one or more emission wavelengths. The substrate absorbs light at the excitation wavelength. The apparatus includes a planarization layer formed on the top surface of the substrate. The planarization layer is transparent to the one or more emission wavelengths. The spectrum shifting material includes one or more of phosphors, quantum dots, and organic dye. The apparatus includes a display device. Each pocket, the spectrum shifting material disposed therein, and the corresponding LED corresponds to a sub-pixel of the display device. The apparatus includes a solid state lighting device.

In an aspect, a method includes disposing spectrum shifting material in each of multiple pockets formed in a top surface of a substrate, the spectrum shifting material configured to emit light at one or more emission wavelengths responsive to absorbing light at an excitation wavelength; and assembling a LED into each of the multiple pockets, each LED configured to emit light at the excitation wavelength, each LED oriented such that light emitted from the LED illuminates the spectrum shifting material disposed in the corresponding pocket.

Embodiments can include one or more of the following features.

The method includes forming the multiple pockets in the top surface of the substrate. The method includes forming the multiple pockets by one or more of embossing and lithography. Disposing the spectrum shifting material includes disposing a first spectrum shifting material in a first subset of the multiple pockets, the first spectrum shifting material configured to emit light at a first emission wavelength; and disposing a second spectrum shifting material in a second subset of the multiple pockets, the second spectrum shifting material configured to emit light at a second emission wavelength. Assembling a LED into each of the multiple pockets includes assembling the LEDs such that a light-emitting face of each micro-LED faces away from the top surface of the substrate. Assembling a-LED into each of the multiple pockets includes concurrently transferring multiple LEDs into corresponding pockets. Concurrently transferring multiple LEDs includes transferring the multiple LEDs by a massively parallel laser-assisted transfer process. The method includes forming an electrical connection to each LED. The method includes forming an electrical connection to a contact on a second face of each LED, the second face opposite a light-emitting face of each LED. The method includes forming a planarization layer on the top surface of the substrate.

BRIEF DESCRIPTION OF DRAWINGS

FIG. 4 is a diagram of a laser-assisted transfer process.

DETAILED DESCRIPTION

We describe here an approach for the massively parallel laser-assisted transfer of discrete components onto a target substrate. This process can enable ultra-fast, high throughput, low-cost assembly of large numbers of discrete components. For instance, light emitting diodes (LEDs) can be rapidly placed onto substrates, thus creating LED arrays for use in devices such as displays or solid state lighting.

Figure 1A:
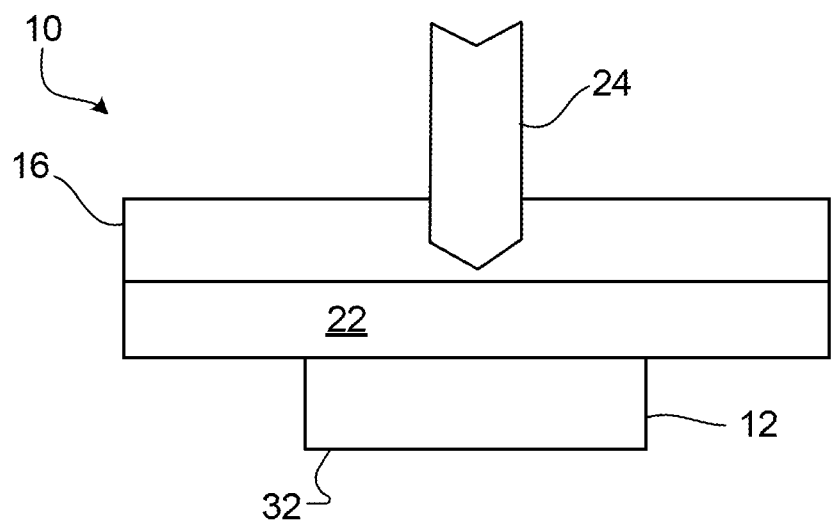
FIGS. 1A and 1B are diagrams of a laser-assisted transfer process.
Figure 1B:
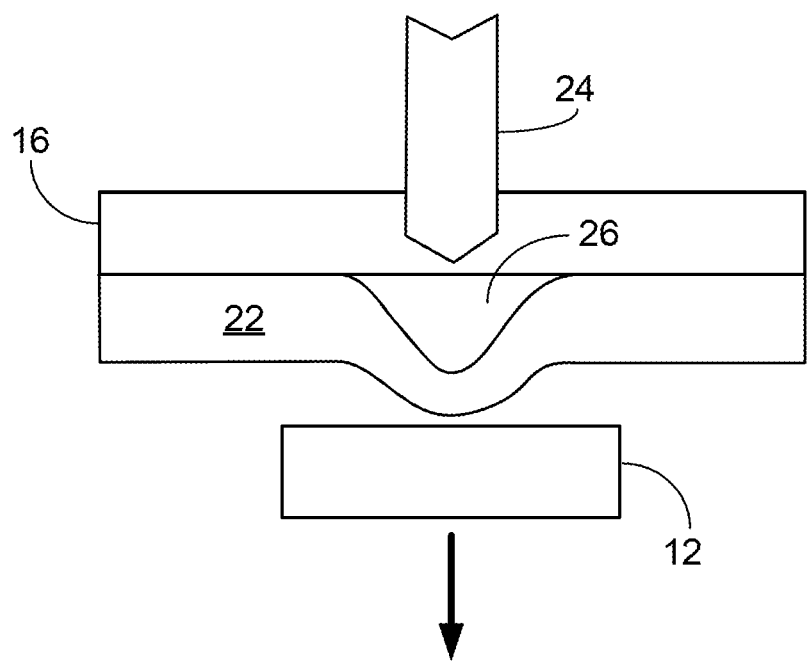

Referring to FIGS. 1A and 1B, a laser-assisted transfer process is used for high-throughput, low-cost contactless assembly of discrete components onto rigid or flexible substrates. The term discrete component refers generally to, for example, any unit that is to become part of a product or electronic device, for example, electronic, electromechanical, photovoltaic, photonic, or optoelectronic components, modules, or systems, for example any semiconductor material having a circuit formed on a portion of the semiconducting material. The discrete components can be ultra-thin, meaning having a maximum thickness of 50 µm or less, 40 µm or less, 30 µm or less, 25 µm or less, 20 µm or less, 10 µm or less, or 5 µm or less. The discrete components can be ultra-small, meaning having a maximum length or width dimension less than or equal to 300 µm per side, 100 µm per side, 50 µm per side, 20 µm per side, or 5 µm per side. The discrete components can be both ultra-thin and ultra-small.

Referring specifically to FIG. 1A, a discrete component 12 is adhered to a carrier substrate 16 by a dynamic release layer 22. The term carrier substrate refers generally to, for example, any material including one or more discrete components, for example, a collection of discrete components assembled by a manufacturer, such as a wafer including one or more semiconductor dies.

The discrete component 12 includes an active face 32, which includes an integrated circuit device. In the example of FIGS. 1A and 1B, the active face 32 of the discrete component 12 faces away from the dynamic release layer 22; in some examples, the active face 32 can face toward the dynamic release layer 22.

Referring also to FIG. 1B, in a blistering transfer process, the energy of the laser beam 24 is applied to a back side 30 of the carrier substrate 16. The carrier substrate 16 is transparent to the wavelength of the laser energy. The laser energy 24 thus passes through the carrier substrate 16 and is incident on an area of the dynamic release layer 22, causing ablation of a partial thickness of the dynamic release layer in the area on which the laser energy 24 is incident (which we refer to as the irradiated area). The ablation generates confined gas, which expands and generates a stress in the non-ablated remainder of the dynamic release layer 22. The stress causes the material of the dynamic release layer to deform elastically, forming a blister 26. If the stress resulting from the elastic deformation exceeds the yield strength of the dynamic release layer material, the dynamic release layer deforms plastically. The blister 26 exerts a mechanical force on the discrete component 12. When the mechanical force exerted by the blister 26 is sufficient to overcome the adhesion between the discrete component 12 and the dynamic release layer 22, the mechanical force exerted by the blister 26 (in combination with gravity) propels the discrete component away from the carrier substrate 16, e.g., for transfer to a target substrate 28.

In an ablative transfer process, the energy of the laser beam 24 is applied to the back side 30 of the transparent carrier substrate, as shown in FIG. 1B. The laser energy 24 incident on an area of the dynamic release layer 22 causes ablation of the complete thickness of the dynamic release layer 22 in the irradiated area, thereby eliminating any adhesion between the discrete component 12 and the carrier substrate 16. The gases generated by the ablation, in combination with gravity, propel the discrete component 12 away from the carrier substrate 16, e.g., for transfer to the target substrate 28.

Further description of a laser-assisted transfer process by blistering of the dynamic release layer can be found in U.S. Patent Publication No. US2014/0238592, the contents of which are incorporated here by reference in their entirety.

In some examples, a laser-assisted transfer process can be used to transfer multiple discrete components concurrently or near concurrently. We sometimes use the term concurrently to mean generally concurrently or near concurrently. This process, sometimes referred to as massively parallel laser-assisted transfer, can enable ultra-fast, high throughput transfer of discrete components onto a target substrate.

Figure 2A:
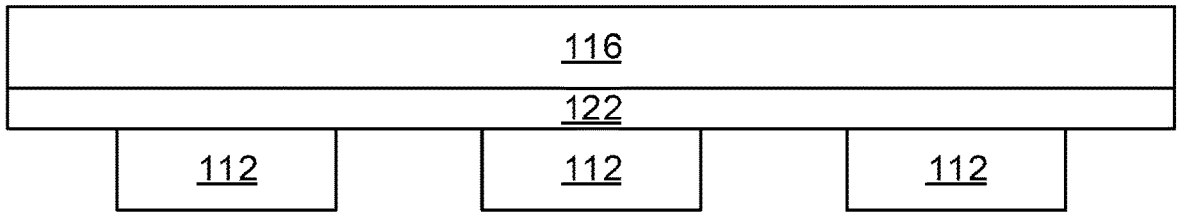
FIGS. 2A-2C are diagrams of a laser-assisted transfer process.

Referring to FIG. 2A, multiple discrete components 112 are adhered to a single carrier substrate 116 by a dynamic release layer 122. The multiple discrete components 112 can be arranged in an array, such as a one-dimensional array or a two-dimensional array. The dynamic release layer 122 of FIG. 2A can include one or more layers.

Figure 2B:
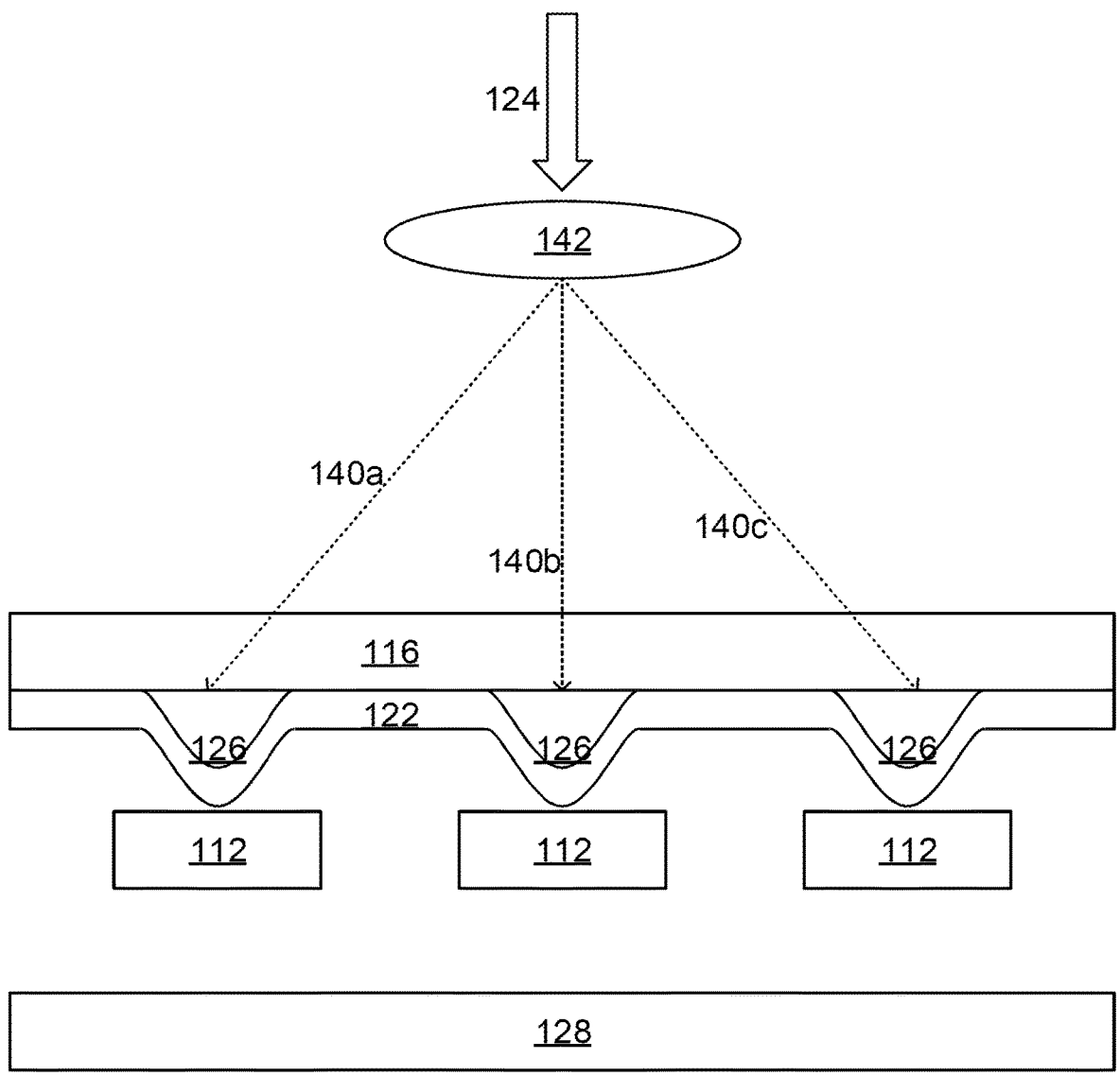

Referring also to FIG. 2B, the energy of the laser beam 124 is used for concurrent laser-assisted transfer of the multiple discrete components 112 onto a target substrate 128. The carrier substrate 116 is transparent to the wavelength of the laser beam 124. The laser beam 124 is divided into multiple beamlets 140a, 140b, 140c by an optical element 142, such as a diffractive optical element, e.g., a beam splitter. By beamlet, we mean a beam of light, such as a beam of light having a smaller size (e.g., diameter) than the laser beam 124. Each of the multiple beamlets 140a, 140b, 140c is incident concurrently with each of the other beamlets on a corresponding region of the dynamic release layer 122 that is aligned with one of the multiple discrete components 112. In a blistering transfer, the laser energy of each of the multiple beamlets 140a, 140b, 140c induces concurrent formation of a blister 126 at each of the regions of the dynamic release layer 122. The concurrent formation of multiple blisters 126 causes all of the discrete components 112 aligned with the irradiated regions of the dynamic release layer 122 to separate concurrently from the dynamic release layer 122, e.g., for transfer to the target substrate 128.

Figure 2C:
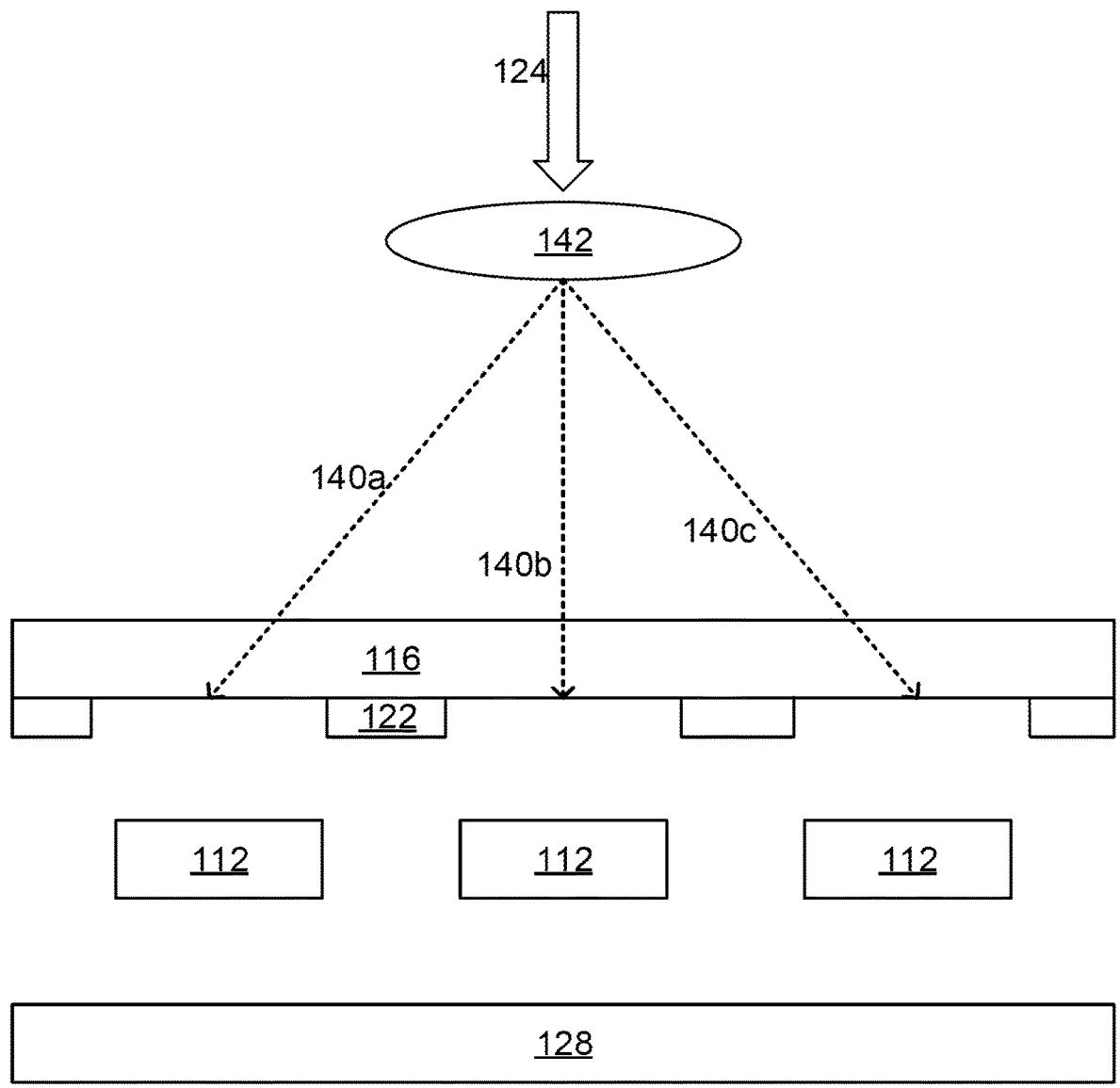

Referring to FIG. 2C, in some examples, an ablative transfer can be used for concurrent laser-assisted transfer of the multiple discrete components 112 onto the target substrate. In concurrent ablative transfer, the laser energy of each of the beamlets 140a, 140b, 140c induces concurrent ablation through the entire thickness of the dynamic release layer 122 in the irradiated regions, thereby causing the discrete components 112 aligned with the irradiated regions to separate concurrently from the dynamic release layer 122, e.g., for transfer to the target substrate 128.

In the example of FIG. 2B, the laser beam 124 is divided into three beamlets to be incident on discrete components 112 arranged in a one-dimensional array. In some examples, the laser beam 124 can be divided into multiple beamlets to be incident on discrete components arranged in a two-dimensional array. The laser beam 124 can be divided into a larger number of beamlets, such as 10 beamlets, 100 beamlets, 500 beamlets, 1000 beamlets, 5000 beamlets, 10,000 beamlets, or another number of beamlets. The number of beamlets into which the laser beam 124 can be divided can be dependent on the energy of the laser producing the laser beam 124. The number of beamlets can be dependent on the size of the discrete components 112 being transferred. For instance, larger discrete components can be transferred using a greater amount of energy than smaller discrete components, and thus the laser beam 124 can be divided into fewer beamlets for transferring larger discrete components than for transferring smaller discrete components.

In some examples, the laser beam 124 is divided into fewer beamlets 140 than the number of discrete components 112. The laser beam 124 can be scanned across the carrier substrate 116 to sequentially transfer subsets of the multiple discrete components 112, where the discrete components in each subset are transferred concurrently. For instance, the laser beam 124 can be divided into a two-dimensional pattern, e.g., to transfer a two-dimensional array of discrete components, and the pattern can be scanned across the carrier substrate to release two-dimensional arrays of discrete components concurrently. In some examples, the pattern can vary for different scan positions, e.g., to account for variations in the type, size, or both of the discrete components on the carrier substrate.

Figure 3:
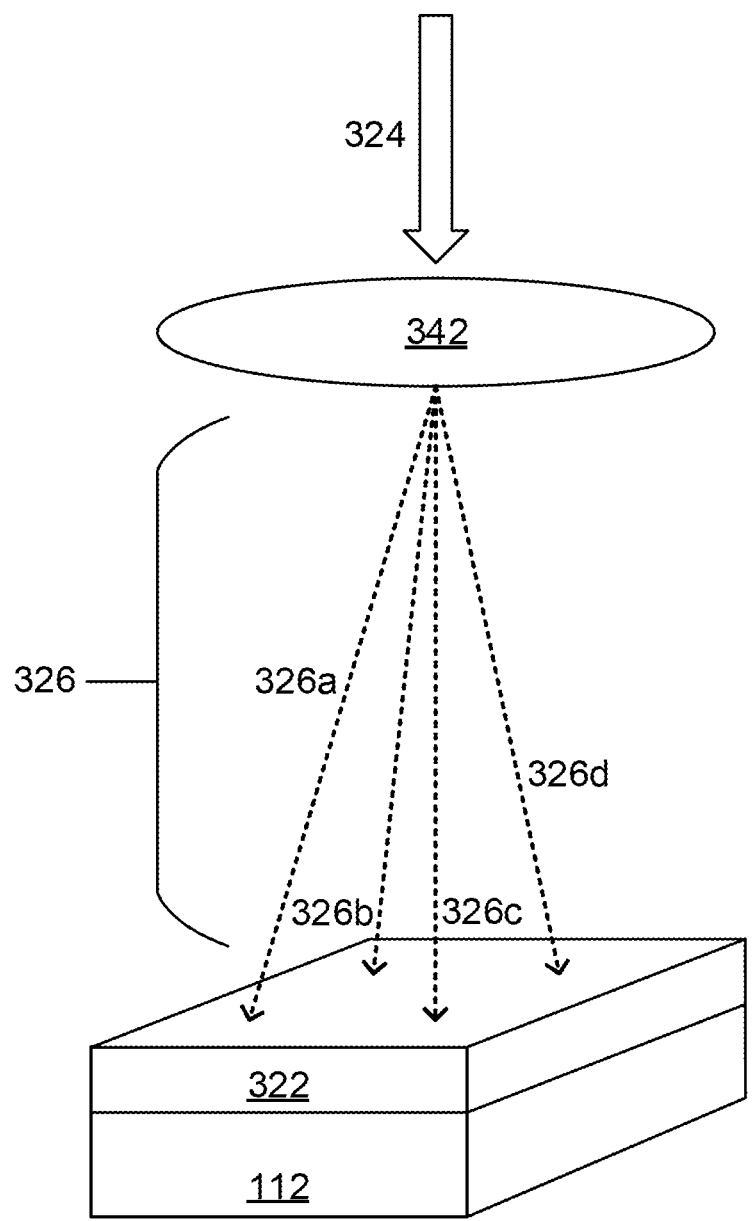
FIG. 3 is a diagram of a laser-assisted transfer process.

FIG. 3 shows a perspective view of a discrete component 112 and a portion of a dynamic release layer 322 aligned with the discrete component 112. The carrier substrate on which the dynamic release layer 322 is adhered is not shown for simplicity. Laser beam 324 is used to transfer the discrete component 112 onto a target substrate. An optical element 342 divides the laser beam 324 into a multi-beamlet pattern 326 that is incident on the dynamic release layer aligned with the discrete component 112. Each beamlet pattern causes either partial-thickness ablation of the dynamic release layer and the formation of blisters, or through-thickness ablation of the dynamic release layer, causing a force to be applied to the discrete component at multiple positions. In the specific example of FIG. 3, the multi-beamlet pattern 326 includes four beamlets 326a, 326b, 326c, 326d oriented such that the beamlets are incident on the dynamic release layer aligned with the four corners of the discrete component 112. This configuration causes a substantially equivalent force to be applied to each corner of the discrete component 112. The use of a multi-beamlet pattern of laser energy to transfer a discrete component can help to achieve high yield and precise placement of the discrete component onto the target substrate.

FIG. 4 is a perspective view of multiple discrete components 112 and a dynamic release layer 422. The carrier substrate to which the discrete components 112 are adhered is not shown for simplicity. Laser beam 424 is used for concurrent transfer of the multiple discrete components 112 onto a target substrate. The laser beam 424 is divided into a multi-beamlet pattern 426 by a first optical element 428 of an optical system, such as a diffractive optical element, e.g., a beam splitter. The multi-beamlet pattern 426 includes multiple beamlets in an arrangement to be incident on the dynamic release layer aligned with a single discrete component. For instance, the multi-beamlet pattern 426 can include four beamlets of laser energy oriented to be incident on the dynamic release layer aligned with the four corners of a discrete component.

The multi-beamlet pattern 426 undergoes a second split at a second optical element 430 of the optical system, such as a diffractive optical element, e.g., a beam splitter. The second split generates multiple groups 432 of the multi-beamlet pattern 426 of laser beams. Each group 432 is incident on a region of the dynamic release layer that is aligned with one of the discrete components 112. The multiple beamlets within each group 432 cause multiple blisters to form in the irradiated regions of the dynamic release layer, or alternatively, cause through-thickness ablation to form in the irradiated regions of the dynamic release layer. This approach enables concurrent transfer of multiple discrete components 112, while the use of multiple beamlets per discrete component can help to achieve high yield and precise placement of the discrete components onto the target substrate.

In the specific example of FIG. 4, the laser beam 424 is divided by the first optical element 428 into a pattern 426 including four beamlets, one beamlet for each corner of a discrete component. The pattern 426 is divided by the second optical element 430 into three groups 432a, 432b, 432d, each group including four beamlets of laser energy. Each group 432 is incident on a region of the dynamic release layer 422 that is aligned with a corresponding one of the multiple discrete components 112, and within each group the four beamlets are incident on the dynamic release layer aligned with the four corners of the corresponding discrete component 112.

In the example of FIG. 4, the optical system includes two optical elements 428, 430. In some examples, the optical system can include a single optical element that divides the laser beam 424 into multiple patterns, each pattern including multiple beamlets of laser energy.

In some examples, the pattern 426 of laser beamlets is divided into fewer groups 432 than the number of discrete components 112. The set of groups 432 can be scanned across the carrier substrate (not shown) to sequentially transfer subsets of the multiple discrete components, where the discrete components in each subset are transferred concurrently.

In examples in which the laser beam is scanned across the carrier substrate, the energy density incident on the dynamic release layer can change as the laser energy is scanned, e.g., due to variations in the distance the laser energy travels from its source and the angle at which the laser energy strikes the dynamic release layer. Differences in energy density can affect the positional accuracy with which the discrete components are transferred onto the target substrate and the yield of the transfer process. In some examples, the energy density (e.g., the laser fluence) can be adjusted to compensate for variations in the angle at which the layer energy strikes the dynamic release layer or variations in the distance between the source of the laser energy and the points at which the laser energy strikes the dynamic release layer. In some examples, the energy density can be adjusted in accordance with changing the pattern of beamlets, e.g., due to a change in a number of discrete components to be transferred concurrently or due to a change in a number of beamlets to be incident on a single discrete component. In some examples, an optical element such as a lens, e.g., a telecentric lens, can be used to reduce the variation in the angle at which the laser energy strikes the dynamic release layer, thus reducing differences in energy density. In some examples, the output power of the laser can be adjusted based on the release process, e.g., adjusted by scan position or by the pattern of beamlets or by another aspect of the release process.

In some examples, the optical system is configured to be switched between single-component mode in which a single discrete component is individually transferred and a multiple-component mode in which multiple discrete components are transferred concurrently. In an example, the multiple discrete components 112 on the carrier substrate may be discrete components from a wafer. Single-component mode can be used to transfer one or more undesired discrete components to a destination, such as a test substrate or a discard. For instance, undesired discrete components can be discrete components having circuitry that failed a test. Multiple-component mode can then be used to transfer one or more of the remaining discrete components to the target substrate.

In some examples, after the multiple-component mode transfer of one or more of the remaining discrete components to the target substrate, single-component mode can be used again to transfer additional discrete components to positions on the target substrate that are missing a discrete component (e.g., because the discrete component at that position had been removed as undesirable, was originally missing from a source substrate, or for another reason). For instance, single-component mode can be used to transfer discrete components that were not transferred during the multiple-component transfer, e.g., discrete components from the circumferential region of a wafer. The ability to transfer discrete components in single-component mode can help increase yield, e.g., by enabling transfer of discrete components, such as components near the edge of a wafer, that may be difficult to include in a group of concurrently transferred discrete components.

In some examples, undesired discrete components can be identified based on a wafer map indicating a characteristic of each of one or more of the discrete components on the carrier substrate. In some examples, the wafer map can be created based on testing before the discrete components are adhered to the carrier substrate. For instance, the wafer map can be created based on a testing of each discrete component following manufacturing of the discrete components, and the undesired discrete components can be those components having circuitry that failed the post-manufacturing test. Testing can include electrical testing of the circuitry of the discrete component, optical testing of the optical output of an LED discrete component, or other types of testing (e.g., testing of the functionality of a sensor on the discrete component or the operation of a microelectromechanical (MEMS) device on the discrete component). In some examples, the wafer map can be created based on in situ testing of the discrete components on the carrier substrate. For instance, when the discrete components are optoelectronic devices, a photoluminescence (PL) test can be performed in which each discrete component is excited with low power laser energy and the optical response after relaxation to ground state is detected. The optical response can be used to characterize the component.

FIGS. 5A-5C and 6A-6C show examples of this multiple-transfer process, which we sometimes call a "good-die-only" transfer process.

Figure 5A:
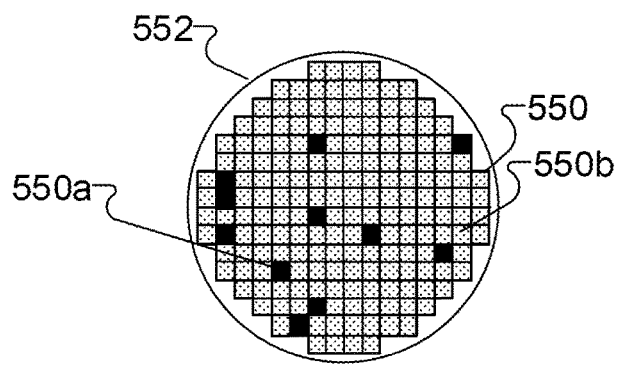
FIGS. 5A-5C are diagrams of a good-die-only transfer process.

Referring specifically to FIG. 5A, discrete components 550 arranged in an array are adhered to a carrier substrate 552 by a dynamic release layer. A mapping indicates a characteristic of each of one or more of the discrete components 550 in the array. For instance, the mapping can be indicative of results of a post-manufacturing test, a quality control test, or an in situ test, e.g., as described above, and can indicate whether each discrete component passed or failed the test. Discrete components that passed the test (e.g., discrete components that satisfy a quality criterion) are sometimes referred to as "good die" and discrete components that failed the test (e.g., discrete components that do not satisfy the quality criterion) are sometimes referred to as "bad die." In the example mapping of FIG. 5A, bad die (e.g., the discrete component 550a) are shaded in dark gray and good die (e.g., the discrete component 550b) are shaded in light gray. In a first transfer step, the bad die are transferred in single-component mode to a destination, such as a test substrate or a discard.

Figure 5B:
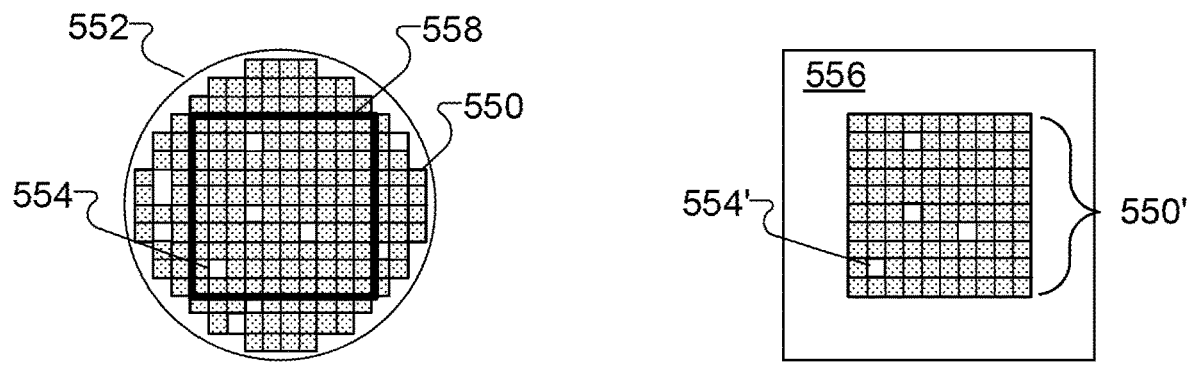

Referring to FIG. 5B, once the bad die have been transferred in the single-component mode transfer, there is an empty position in the array on the carrier substrate 552 where each bad die was originally located. For instance, an empty position 554 in the array corresponds to the location of the bad die 550a. At least a portion of the remaining discrete components, which are the good die, are transferred to a target substrate 556 in a second, multiple-component transfer step, thus forming a second array of transferred discrete components 550' on the target substrate.

A transfer field 558 can define on the carrier substrate 552 a region of a desired size, a region encompassing a desired number array positions, or a region encompassing a desired number of discrete components. The multiple-component transfer process can transfer only some or all of those discrete components that are encompassed within the transfer field 558. Any discrete components that are outside the transfer field 558 are not transferred to the target substrate 556, and remain on the carrier substrate 552 as remaining discrete components 560. In the example of FIG. 5B, the transfer field 558 is sized to encompass a 10×10 array, and the multiple-component transfer process transfers all of the discrete components encompassed within the transfer field. The array of transferred discrete components 550' on the target substrate 556 is thus a 10×10 array of discrete components (and empty positions, if any) in which the relative positioning of discrete components and empty positions is preserved. The transfer field can be sized based on a desired size or number of discrete components for a downstream application, such as a light emitting diode (LED) based display.

Figure 5C:
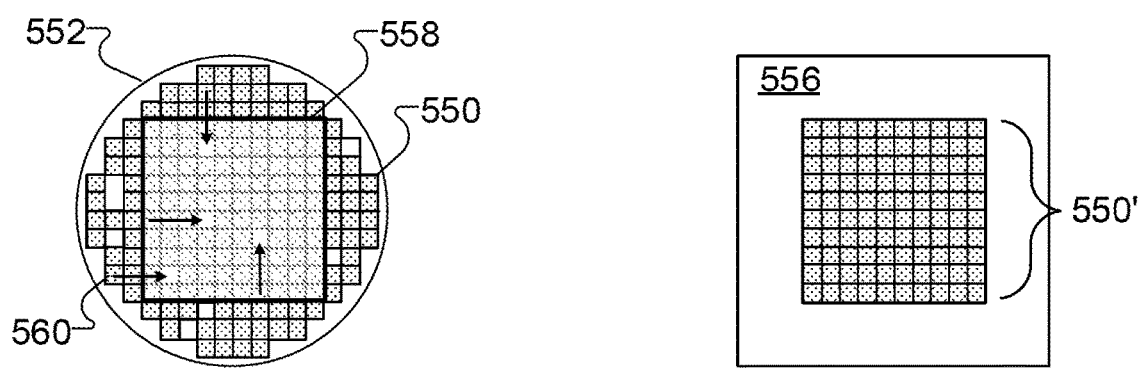

Referring to FIG. 5C, in some examples, the empty positions in the array of transferred discrete components 550' on the target substrate are filled in by a third transfer step. In the third transfer step, each of one or more of the remaining discrete components 560 (e.g., a remaining good discrete component) is transferred in a single-component mode transfer process to one of the empty positions (e.g., the empty position 554', see FIG. 5B) on the target substrate 556. In some examples, the empty positions can be filled in by transferring discrete components from a different carrier substrate, e.g., if there are not enough discrete components remaining on the carrier substrate 552 or if a different type of discrete component is desired. At the completion of the third transfer process, the array of transferred components 550' on the target substrate 556 is a complete array of good discrete components with no empty positions.

Figure 6A:
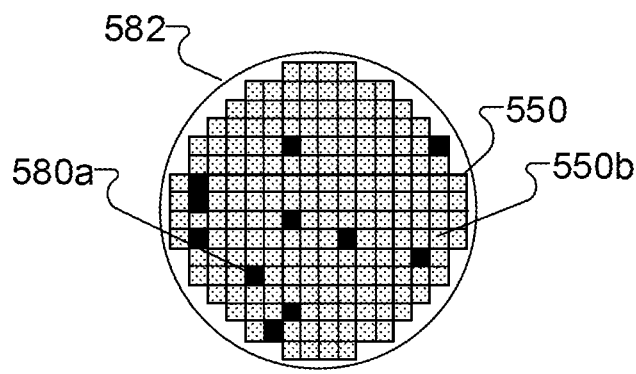
FIGS. 6A-6C are diagrams of a good-die-only transfer process.
Figure 6B:
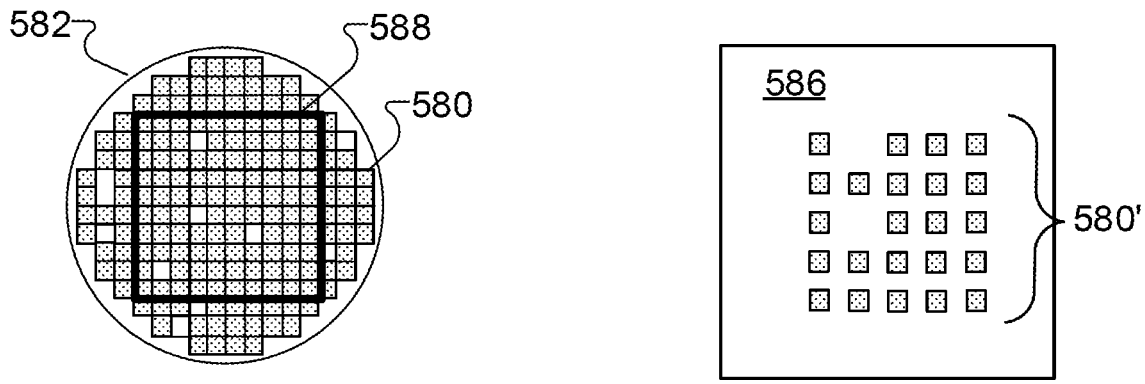
Figure 6C:
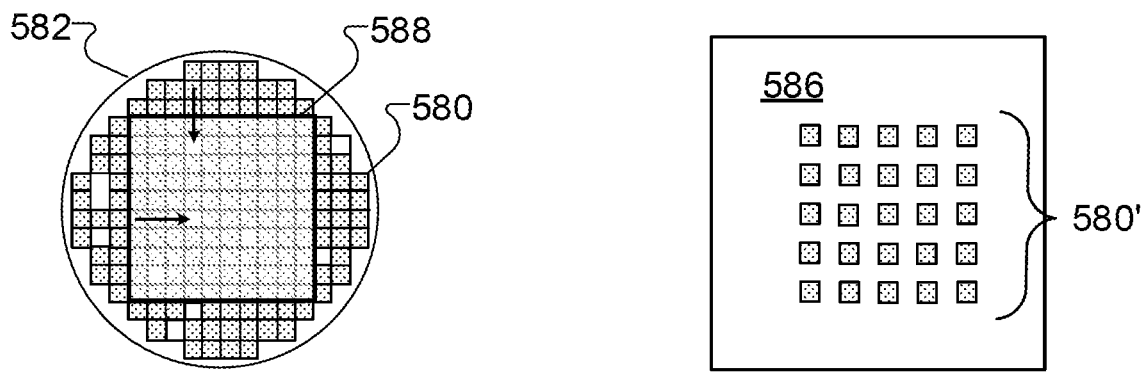

Referring to FIGS. 6A-6C, in some examples, a good-die-only transfer process transfers a specified pattern of discrete components from the carrier substrate to the target substrate. Referring specifically to FIG. 6A, discrete components 580 arranged in an array are adhered to a carrier substrate 582 by a dynamic release layer. A mapping of a characteristic of the discrete components 580 indicates bad die (e.g., the discrete component 580a) in dark gray and good die (e.g., the discrete component 580b) in light gray. In a first transfer step, the bad die are transferred in single-component mode to a destination, such as a test substrate or a discard.

Referring to FIG. 6B, once the bad die have been transferred in the single-component mode transfer, there is an empty position in the array on the carrier substrate 582 where each bad die was originally located. A pattern of the remaining discrete components, which are the good die, are transferred to a target substrate 586 in a second, multiple-component transfer step, thus forming a second transferred array of transferred discrete components 580' on the target substrate. For instance, a pattern of discrete components encompassed within a transfer field 588 can be transferred. In the example of FIG. 6B, the discrete components at every other location in the array on the carrier substrate 582 is transferred; if there is an empty position at one of these locations, that empty position remains also in the transferred array. Referring to FIG. 6C, in some examples, the empty positions in the array of transferred discrete components 580' on the target substrate are filled in by a third transfer step, e.g., by transferring remaining discrete components from the carrier substrate 582 or from another carrier substrate.

In some examples, the third transfer step is not executed and the empty positions in the array of transferred discrete components remain when the target substrate is provided to downstream application. For instance, the third transfer step can be eliminated if the density of discrete components in the array is sufficient that a small number of empty positions will not substantially affect the performance of the array in the downstream application. In some examples, the third transfer step is optional and can be carried out based on the array of transferred discrete components satisfying (or not satisfying) a quality characteristic. For instance, the third transfer step can be executed when there are more than a threshold number or percentage of empty positions, or when a threshold number of empty positions are adjacent to other empty positions.

Figure 7:
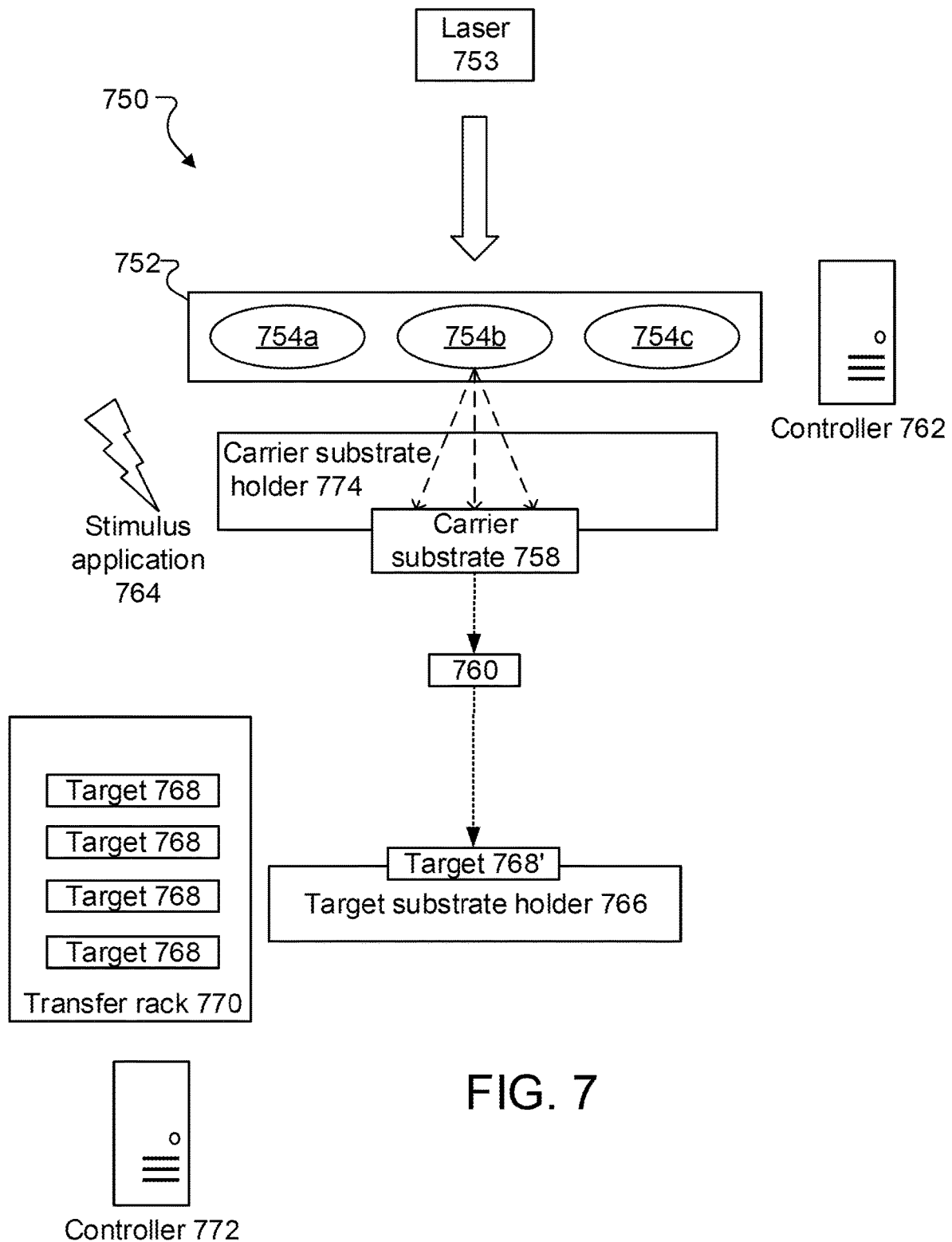
FIG. 7 is a diagram of an apparatus.

Referring to FIG. 7, the good-die-only process such as that shown in FIGS. 5A-5C and 6A-6C can be carried out on a transfer apparatus 750 that is capable of switching between multiple-component mode and single-component mode. For instance, the transfer apparatus 750 can include an automated optical element changer 752 that enables various optical systems 754a, 754b, 754c to be moved into alignment with a laser 753, e.g., depending on the type of transfer process (e.g., multiple-component mode or single-component mode). In an example, the optical system 754a can be a single-beam system and the optical systems 754b, 754c can be multi-beam systems with different beam configurations. Other configurations of optical systems are also possible. In some examples, the transfer apparatus 750 can include multiple optical elements in the path of the laser beam or beamlets, and the automated optical element changer 752 can move one of the multiple optical elements into or out of the path. The transfer apparatus can include a scanning mechanism (not shown) that can scan the laser beam or beamlets output from each optical system across the surface of a carrier substrate 758 to transfer one or more discrete components 760.

The apparatus can be computer-controlled by one or more local or remote computers or controllers 762 such that the end-to-end multiple-transfer process can be automated. For instance, a controller can control the alignment of the laser beam or beamlets with each discrete component to be transferred in the first single-component mode transfer. The controller can control the alignment of the laser beam or beamlets with the discrete components to be transferred in the second multi-component transfer. The controller can control the alignment of the laser beam or beamlets with each of the remaining discrete components to be transferred in the single-component mode third transfer, and can control the alignment of the carrier substrate with the target substrate during the single-component mode third transfer. The apparatus can include a stimulus application device 764 configured to output a stimulus, such as ultraviolet light or heat, to be applied to the carrier substrate, e.g., to reduce the adhesion of the dynamic release layer.

The transfer apparatus can include a target substrate holder 766 for holding the target substrate. In some examples, the target substrate holder 766 can hold multiple target substrates. In some examples, such as in the example apparatus 750 of FIG. 7, the target substrate holder 766 can hold a single target substrate 768' in position to receive discrete components transferred from the carrier substrate 758. A transfer rack 770 configured to hold one or more target substrates 768 can be controlled by a controller 772 to move individual target substrates from the transfer rack 770 to the target substrate holder 766. As an example, a first target substrate can be held by the target substrate holder 766 to receive a first transfer (e.g., bad die) from the carrier substrate 758. A second target substrate can then be transferred from the transfer rack 770 into the target substrate holder 766 to receive a second transfer (e.g., good die) from the carrier substrate 758.

The transfer apparatus can include a carrier substrate holder 774 for holding the carrier substrate 758. In some examples, the carrier substrate holder 774 can hold multiple carrier substrates. In some examples, such as in the example apparatus 750 of FIG. 7, the carrier substrate holder 774 can hold a single carrier substrate. In some examples, a transfer rack (not shown) configured to hold one or more carrier substrates can be controlled to move individual substrates from the transfer rack to the carrier substrate holder 774.

Figure 8:
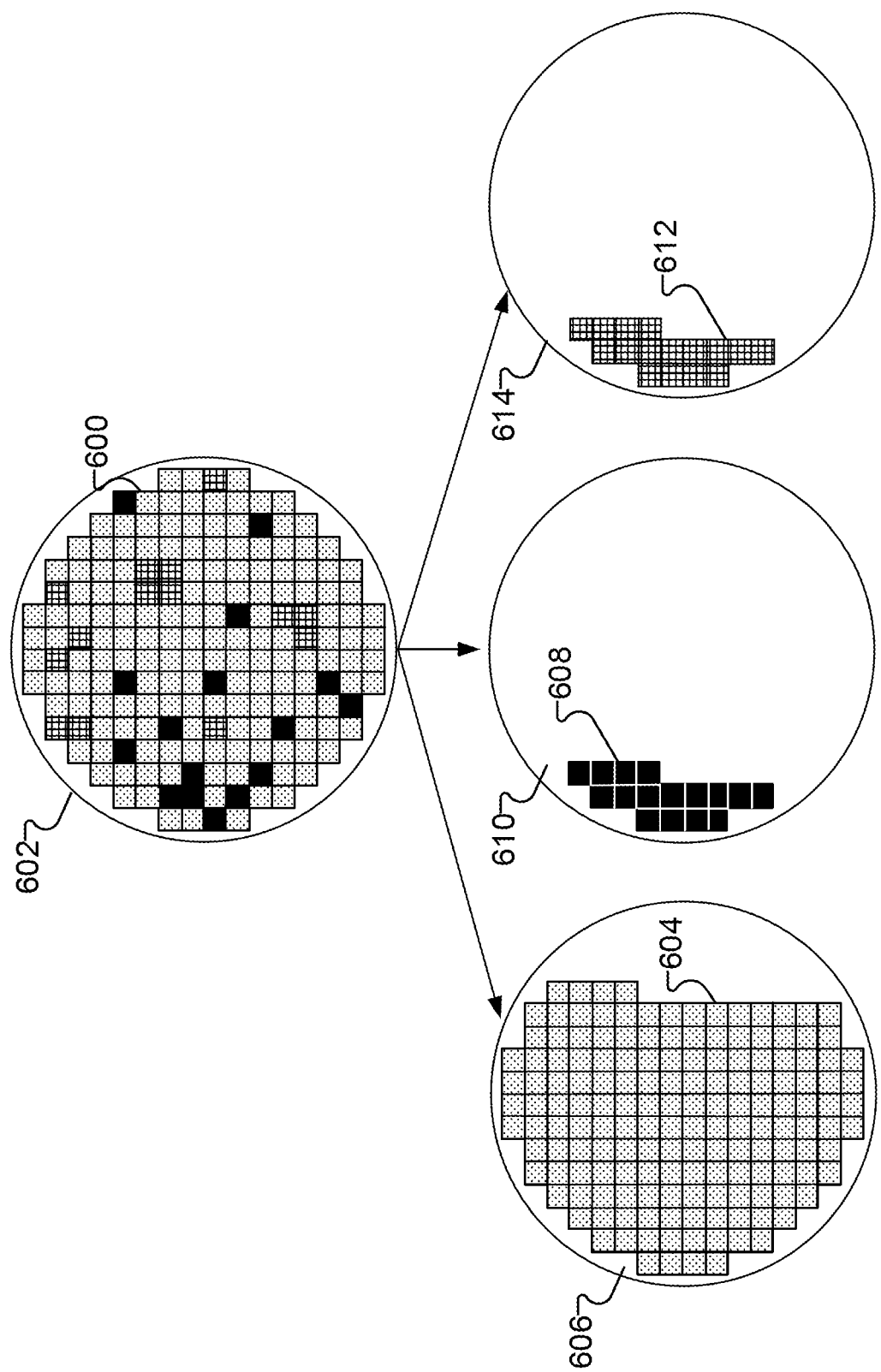
FIG. 8 is a diagram of a component sorting process.

Referring to FIG. 8, in some examples, single-component mode or multiple-component mode can be used to sort discrete components 600 held on a carrier substrate 602 by one or more characteristics of the discrete components. For instance, when the discrete components are LEDs, the characteristic can be an emission wavelength, quantum output, a turn-on voltage, a light intensity, a voltage-current characteristic, or another characteristic, or a combination of any two or more of them. The characteristic can be indicated in a mapping that indicates the characteristic for each of one or more of the discrete components held on the carrier substrate 602. In the sorting process, each set of discrete components that share a common characteristic or combination of characteristics is transferred to a corresponding target substrate, resulting in a set of target substrates, each target substrate having a set of discrete components that share a common characteristic (e.g., a characteristic falling into a common range) or combination of characteristics. The discrete components sharing a common characteristic or combination of characteristics can be transferred individually in single-component mode or concurrently in multiple-component mode.

The transfer apparatus 750 of FIG. 7 can be used for sorting discrete components by characteristics of the discrete components. In some examples, the target substrate holder 766 can hold multiple target substrates, and discrete components from a single carrier substrate 758 can be transferred to respective target substrates held in the target substrate holder 766 based on a characteristic of the discrete components. In some examples, the target substrate holder 766 can hold a single target substrate. A first set of discrete components from the carrier substrate 758 sharing a common characteristic or combination of characteristics can be transferred to a first target substrate held in the target substrate holder 766. A second target substrate can then be transferred into the target substrate holder 766 and a second set of discrete components with a different common characteristic or combination of characteristics can be transferred to the second target substrate.

In the example of FIG. 8, discrete components 604 having a first characteristic in common (e.g., LEDs having an emission wavelength in a first range) are transferred from the carrier substrate 602 to a first target substrate 606 in a first multiple-component mode transfer. Discrete components 608 having a second characteristic in common (e.g., LEDs having an emission wavelength in a second range) are transferred from the carrier substrate 602 to a second target substrate 610 in a second multiple-component mode transfer. Discrete components 612 having a third characteristic in common (e.g., LEDs having an emission wavelength in a third range) are transferred from the carrier substrate 602 to a third target substrate 614 in a third multiple-component mode transfer. Although three target substrates are shown in FIG. 8, the sorting process can transfer sets of discrete components to any number of target substrates.

Figure 9:
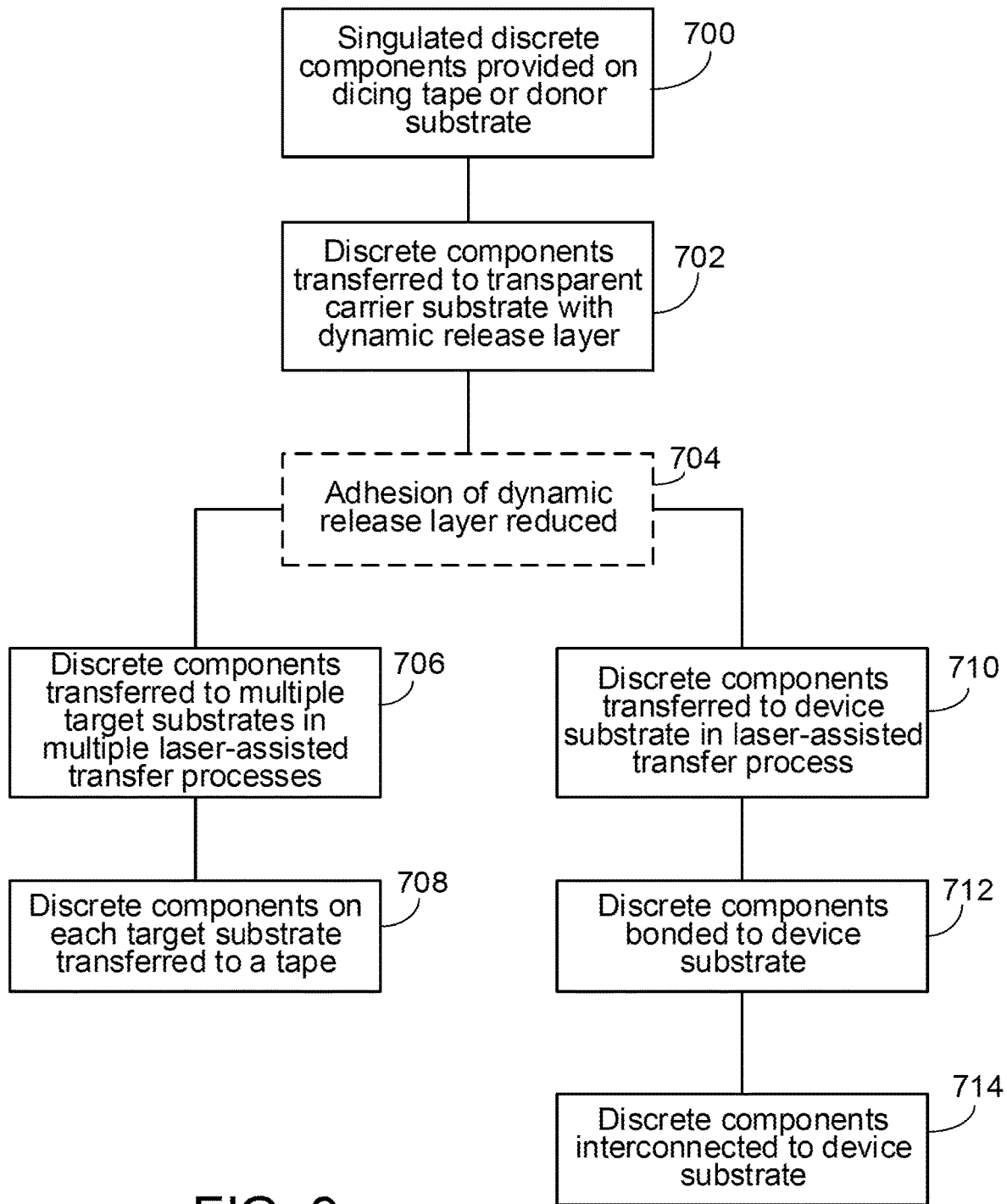
FIG. 9 is a flow chart.

Referring to FIG. 9, in an example process for transferring discrete components, singulated discrete components are provided on a temporary substrate, such as a dicing tape; or on a donor substrate such as a wafer, e.g., a silicon wafer or a sapphire wafer (700). For instance, a wafer can be adhered to the dicing tape and diced into the discrete components. Prior to adhering the wafer to the dicing tape, the wafer can be thinned, e.g., to a thickness of about 50 μm. Further description of dicing a wafer into discrete components is provided in PCT Application Serial No. PCT/US2017/013216, filed Jan. 12, 2017, the contents of which are incorporated here by reference in their entirety.

The singulated discrete components are transferred from the temporary substrate to a transparent carrier substrate having a dynamic release layer disposed thereon (702). In some examples, the carrier substrate can be provided with the dynamic release layer already applied. In some examples, the dynamic release layer is applied to the carrier substrate. The carrier substrate is formed of a material, such as glass or a transparent polymer, that is at least partially transparent to at least some wavelengths of the ultraviolet, visible, or infrared electromagnetic spectrum, including the wavelength(s) to be used during the subsequent laser assisted transfer process. In some examples, components of a singulated wafer are transferred directly to the carrier substrate without the use of a temporary substrate. For instance, direct transfer of singulated components can be used to transfer epi-layer thick micro-LEDs from a growth substrate to a carrier substrate using a laser lift-off process.

In some examples, the singulated discrete components are transferred to the carrier substrate in a good-die-only transfer process in which "bad die" are first removed from the temporary substrate and the remaining "good die" are then transferred to the carrier substrate.

The discrete components are transferred from the temporary substrate to the carrier substrate by contacting the discrete components on the temporary substrate to the dynamic release layer on the carrier substrate. In some examples, when the temporary substrate is a dicing tape, the dicing tape can be formed of a material that undergoes a reduction in adhesion responsive to a stimulus, such as heat or ultraviolet light. When the dicing tape is exposed to the stimulus, the adhesion of the dicing tape is reduced, thereby facilitating the transfer of the discrete components to the carrier substrate. Further description of transferring discrete components onto a carrier substrate is provided in PCT Application Serial No. PCT/US2017/013216, filed Jan. 12, 2017, the contents of which are incorporated here by reference in their entirety.

In some examples, the discrete components can be transferred to the carrier substrate before dicing, e.g., as a whole or partial wafer. For instance, the wafer or partial wafer can be mounted on the carrier substrate and then the wafer can be diced into the discrete components. In some examples, the wafer can be partially diced prior to the transfer to the carrier substrate and the dicing can be completed after the transfer to the carrier substrate.

In some examples, the dynamic release layer can be a material with controllable adhesion, such as a material with an adhesion that can be reduced upon exposure to a stimulus, such as heat, ultraviolet light, or another stimulus. When the discrete components are transferred to the carrier substrate, a highly adhesive dynamic release layer facilitates the transfer and helps to secure the discrete components on the carrier substrate. However, a less adhesive dynamic release layer can facilitate a subsequent laser-assisted transfer of the discrete components to a target substrate. Accordingly, in some examples, once the discrete components have been transferred to the carrier substrate, the adhesion of the dynamic release layer is reduced (704), e.g., by exposing the dynamic release layer to a stimulus such as heat or ultraviolet light. Adhesion reduction causes reduced adhesion for the entire dynamic release layer, and facilitates subsequent laser-assisted transfer. Adhesion reduction is optional, as indicated by the dashed line border in FIG. 8. For instance, in an ablative laser-assisted transfer process, adhesion reduction is not generally performed. Further description of dynamic release layers having controllable adhesion is provided in PCT Application Serial No. PCT/US2017/013216, filed Jan. 12, 2017, the contents of which are incorporated here by reference in their entirety.

In some examples, in a sorting process, the discrete components are transferred from the carrier substrate to multiple target substrates in multiple laser-assisted transfer processes (706). For instance, the discrete components can be transferred to target substrates based on a characteristic of the discrete components, thereby sorting the discrete components by that characteristic. The outcome of the sorting process is a set of target substrates, each target substrate having a set of discrete components that share a common characteristic.

In some examples, each target substrate can have die catching material disposed thereon. The die catching material (DCM) can be a material that receives discrete components as they are transferred from the carrier substrate and keeps them in their targeted positions while reducing post-transfer movement of the discrete components on the target substrate. The DCM can be selected based on properties such as surface tension, viscosity, and rheology. For instance, the DCM can provide viscous drag to prevent discrete component movement, or can prevent discrete component movement by another externally-applied force, such as an electrostatic force, a magnetic force, a mechanical force, or a combination of any two or more of them.

In some examples, the target substrates are provided with the die catching material already applied. In some examples, the DCM is applied to the target substrates prior to transfer of the discrete components. DCM can be applied as a continuous film, e.g., with a thickness of between about 3 μm and about 20 using a film deposition method such as spin coating, dip coating, wire coating, doctor blade, or another film deposition method. Alternatively, DCM can be applied as a discrete, patterned film, e.g., in the locations at which discrete components are to be placed. A patterned DCM film can be formed by material printing techniques such as stencil printing, screen printing, jetting, inkjet printing, or other techniques. A patterned DCM film can also be formed by pre-treating the target substrate with a pattern of a material that attracts the DCM, a material that repels the DCM, or both, and then using a continuous film deposition method to deposit the DCM, resulting in DCM in the regions with the DCM-attracting material (or in the regions without the DCM repelling material). For instance, the target substrate can be patterned with hydrophilic material, hydrophobic material, or both.

In some examples, the discrete components on each target substrate are transferred to a corresponding second substrate, such as a tape (708). Because the discrete components were sorted by characteristic during the transfer to the target substrate, each tape will thus also receive discrete components sharing a common characteristic. The tapes can be provided for downstream applications, e.g., to end product manufacturers. The transfer of the discrete components to the second substrate can be a contact transfer. When the target substrates include a layer of die catching material with controllable adhesion, the attachment element can be exposed to a stimulus to reduce the adhesion, thereby facilitating transfer of the discrete components.

In some examples, the discrete components are transferred to a device substrate in a laser-assisted transfer process (710). The transfer of the discrete components to the device substrate can include a good-die-only transfer process as described above, in which bad die are first transferred from the carrier substrate to a discard, and an array of good die is then transferred concurrently from the carrier substrate to the device substrate.

In some examples, the device substrate can have a conductive attachment element disposed thereon to enable die catching and interconnection. The attachment element cures responsive to an applied stimulus, such as a material that is thermally curable, curable upon exposure to ultraviolet light, or curable in response to another type of stimulus, or a combination of any two or more of them. In some examples, the device substrate is provided with the attachment element already applied. In some examples, the attachment element is applied to the target substrates prior to transfer of the discrete components. In some examples, the device substrate can have an attachment element disposed thereon that serves as a flux during soldering, and the die catching material is activated by heating to facilitate soldering as a process for interconnection of the discrete components. Further description of attachment elements is provided in PCT Application Serial No. PCT/US2017/013216, filed Jan. 12, 2017, the contents of which are incorporated here by reference in their entirety.

The discrete components are bonded to the device substrate (712). For instance, the attachment element can be cured, e.g., by exposure to a stimulus such as a high temperature, ultraviolet light, or another stimulus, or a combination of any two or more of them, thereby increasing the adhesion of the attachment element. The stimulus can be removed after a time sufficient to allow the attachment element to cure, thus forming a mechanical bond, an electrical bond, or both, between the device substrate and the discrete components. Further description of bonding discrete components to a device substrate is provided in PCT Application Serial No. PCT/US2017/013216, filed Jan. 12, 2017, the contents of which are incorporated here by reference in their entirety.

The discrete components are interconnected to the device substrate (714) to establish electrical connections between circuit elements on the discrete components and circuit elements on the device substrate. In some examples, the discrete components are interconnected to the device substrate in a face-up orientation with the active face of the discrete component facing away from the device substrate. The active face of a discrete component is the surface on which the circuitry of the discrete component is formed. For face-up discrete components, interconnection can include wire bonding, isoplanar printing (in which a conductive material is printed onto the device substrate and the active face of the discrete component), direct write material deposition, thin film lithography, or other interconnection methods. In some examples, the discrete components are interconnected to the device substrate in a face-down orientation (sometimes referred to as "flip-chip") with the active face of the discrete component facing toward the device substrate. Flip-chip interconnection can include adhesive bonding, soldering, thermocompression bonding, ultrasonic bonding, or other flip-chip interconnection methods.

Figure 10:
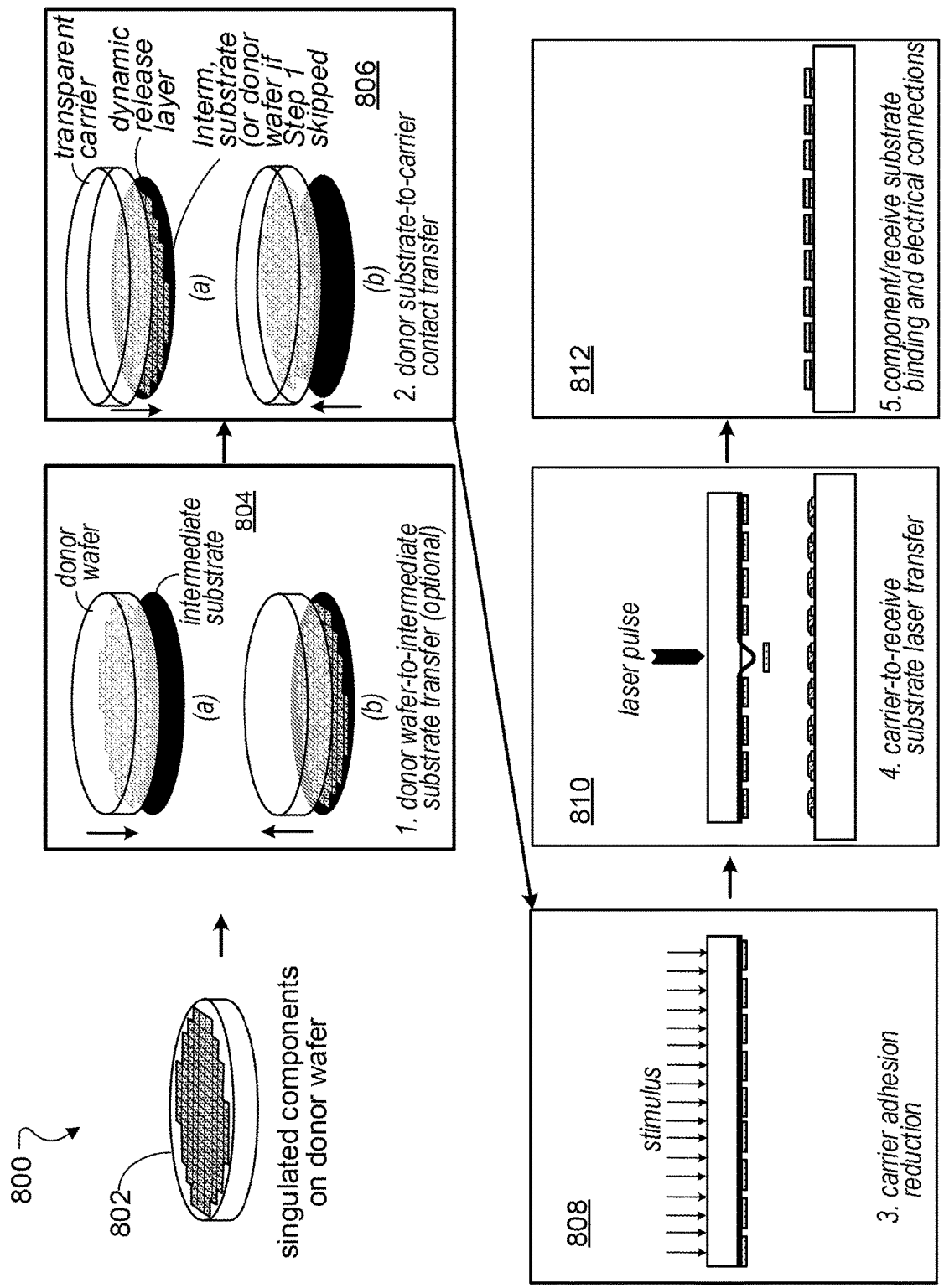
FIG. 10 is a diagram of a laser-assisted transfer process.

Referring to FIG. 10, in an example process 800 for transferring discrete components, such as micro LEDs, singulated discrete components are provided on a substrate (802), such as a wafer, e.g., a sapphire wafer.

In some examples, the discrete components are transferred to an intermediate substrate (804), e.g., by contacting the discrete components on the donor substrate to the intermediate substrate. For instance, an intermediate substrate can be used for cases in which the discrete component is to be flipped (i.e., turned over 180°) for an ultimate downstream application. An intermediate substrate can also sometimes improve a metric associated with the transfer process, such as yield, accuracy, or another metric. The discrete components are then transferred from the intermediate substrate to a transparent carrier substrate having a dynamic release layer disposed thereon (806).

In some examples, the intermediate substrate is not used and the discrete components are transferred directly from the donor substrate to the transparent carrier substrate. In such cases, the aspect 804 of the transfer process is skipped and the aspect 806 of the transfer process is a transfer of the discrete components from the donor substrate directly to the transparent carrier substrate. The transfer of the discrete components from the substrate (e.g., the sapphire wafer) to either the intermediate substrate or the carrier substrate can be performed by a laser liftoff process. In a laser liftoff process, the active (functional) layers of a component are separated from a substrate by changing the material composition at an interfacial layer between the functional layers and the substrate. For instance, in a laser liftoff process of GaN micro-LEDs grown epitaxially on a sapphire substrate, a laser (e.g., an ultraviolet laser) is focused on the interface between the GaN layers of the micro-LEDs and the sapphire substrate. The high temperature in the area on which the laser is focused causes decomposition of a thin (e.g., less than 1 µm thick) layer of GaN into gallium and nitrogen. The melting point of gallium is very low (about 30° C.), thus enabling the functional GaN layers of the micro-LEDs to be easily removed by melting the gallium layer.

The adhesion of the dynamic release layer is reduced (808) by application of a stimulus, such as heat, ultraviolet light, or another type of stimulus. The discrete components are then transferred using a laser-assisted transfer process to a device substrate (810). In the example of FIG. 10, the discrete components are shown as being transferred individually in single-component mode. In some examples, multiple discrete components can be transferred concurrently in multiple-component mode. In some examples, the discrete component transfer includes the good-die-only process in which bad die are removed from the carrier substrate in a first transfer process and good die are then transferred to the device substrate in a second transfer process. The discrete components on the device substrate are bonded to the device substrate and interconnected to circuit elements on the device substrate (812).

The approaches described above for massively parallel laser-assisted transfer of multiple discrete components can be used to assemble micro-LEDs for use in micro-LED-based devices, such as displays, e.g., television screens or computer monitors; or solid state lighting. Micro-LED-based devices include an array of micro-LEDs, each micro-LED forming an individual pixel or sub-pixel element. In some examples, colors can be achieved by using micro-LEDs that emit different wavelengths. In some examples, colors can be achieved by using micro-LEDs in conjunction with spectrum shifting materials such as organic dyes, phosphors, quantum dots, or by using color filters.

By micro-LEDs, we mean LEDs having at least one lateral dimension of at most 100 microns. By spectrum-shifting material, we mean a material that is excited by light at a first wavelength (sometimes referred to as an excitation wavelength) to emit light at a second wavelength (sometimes referred to as an emission wavelength) different from the excitation wavelength. When a spectrum shifting material is implemented by color filters, the color of the spectrum shifting material is the color that corresponds to the wavelength of light emitted by the spectrum shifting material. When a spectrum shifting material is implemented by quantum dots, the color of the spectrum shifting material depends on the size of the quantum dots. When a spectrum shifting material is implemented by organic dyes or phosphors, the color of the spectrum shifting material depends on the composition of the dye or phosphor.

Figure 11A:
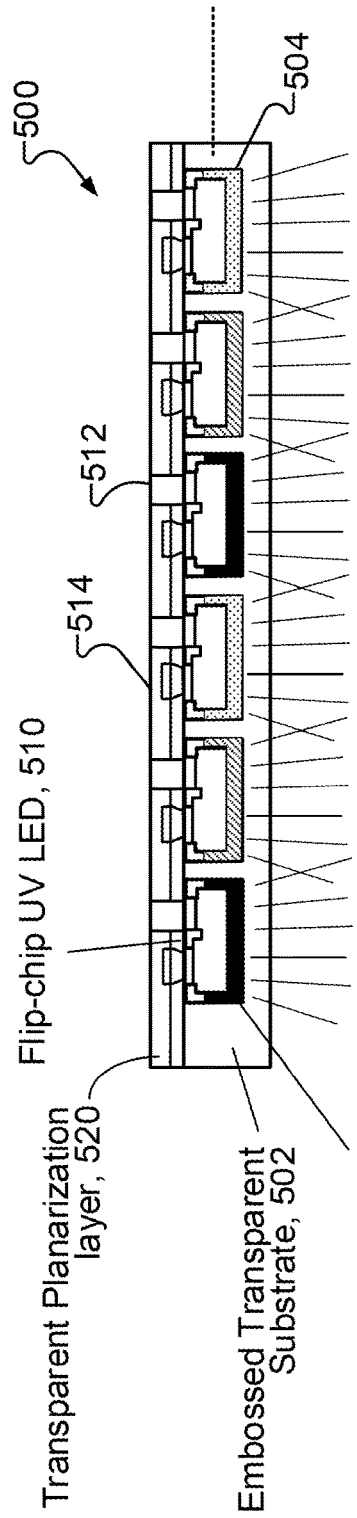
FIGS. 11A and 11B are diagrams of a micro-light emitting diode (LED) device.
Figure 11B:
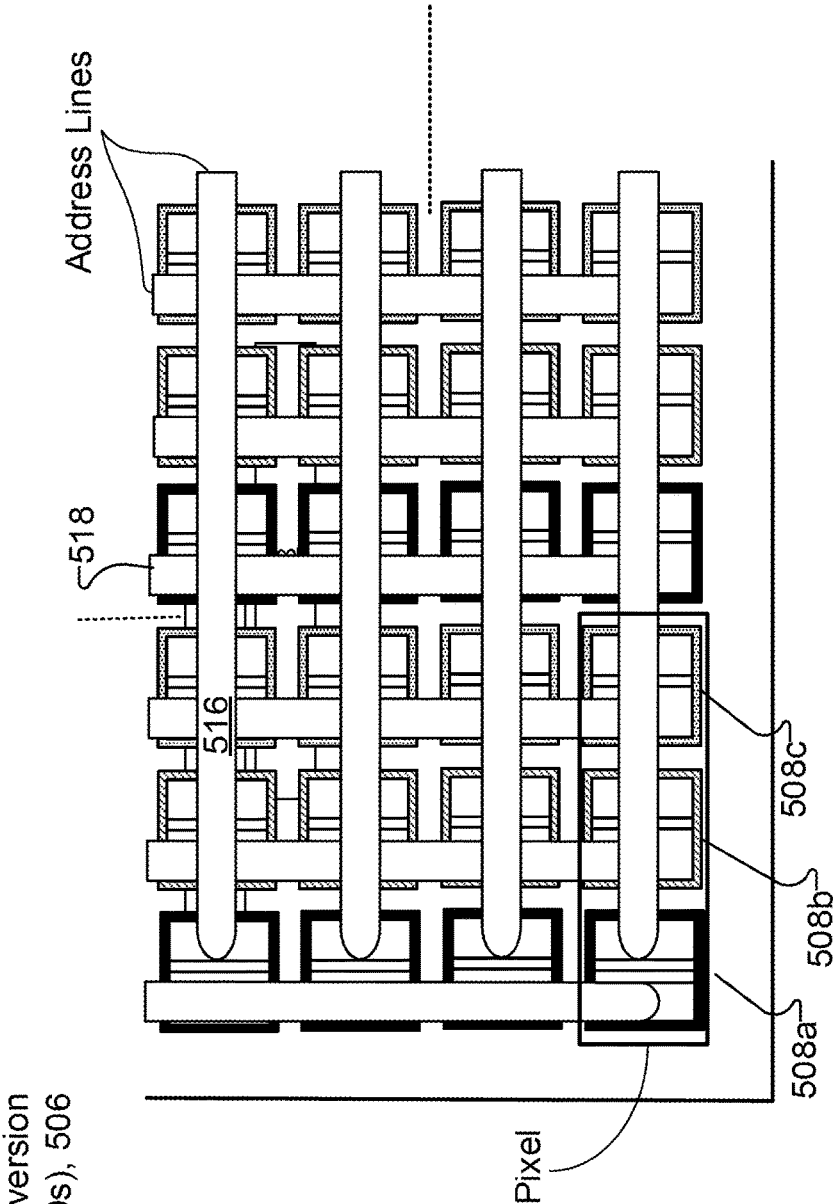

Referring to FIGS. 11A and 11B, a micro-LED device 500 includes a substrate 502 with an array of pockets 504 formed in a top surface of the substrate 502. Each pocket 504 corresponds to a sub-pixel of the device 500. The pockets 504 can be formed by embossing, lithography, or another manufacturing method. Spectrum shifting material 506 is disposed in at least some of the pockets 504. The color of the spectrum shifting material 506 can vary across the array of pockets 504, e.g., by row, by column, in another pattern, or randomly. In the example of FIGS. 11A and 11B, the color of the spectrum shifting material 506 varies by column of the array of pockets 504, such that a first column 508a has red spectrum shifting material in its pockets 504, a second column 508b has green spectrum shifting material in its pockets 504, and a third column 508c has blue spectrum shifting material in its pockets. The substrate 502 can be made of a material that is transparent to the colors of the spectrum shifting material. For instance, the substrate 502 can be glass or a transparent polymer.

A micro-LED 510 is placed into each pocket 504 in the substrate 502. For instance, the micro-LEDs 510 can be placed into the pockets 504 using the approaches described above for massively parallel laser-assisted transfer of multiple discrete components. The micro-LEDs 510 are placed in the pockets 504 with the spectrum shifting material 506 encompassing the light-emitting surfaces and side surfaces of the micro-LEDs 510. The micro-LEDs 510 emit light of a wavelength that can excite the spectrum shifting material 506 to emit light. For instance, the micro-LEDs can emit ultraviolet light.

In the example of FIGS. 11A and 11B, the micro-LEDs 510 are controlled by a passive matrix in which electrical contacts 512 on the opposite side of the micro-LEDs 510 are exposed toward a top surface 514 of the substrate 502. Row and column electrodes 516, 518 are connected to the electrical contacts 512 of the micro-LEDs 510, providing a way to address each micro-LED 510 individually to excite a given pixel or sub-pixel of spectrum shifting material 506. A planarization layer 520 is formed over the top surface 514. The planarization layer 520 can be transparent or opaque to light from the spectrum shifting material 506. In some examples, the micro-LEDs are controlled by active matrix technology in which each micro-LED is controlled individually using electronic components such as thin film transistors and capacitors.

The transparent substrate is transparent to the light emitted by the spectrum shifting materials but absorbs the light emitted by the micro-LEDs. The planarization layer can be transparent or opaque to the light emitted by the spectrum shifting material.

In some examples, the walls of the substrate 502 between the pockets 504 absorb the light emitted by the micro-LEDs 510, preventing the light from one micro-LED from exciting the spectrum shifting material 506 in a different pocket 504 and thus reducing or eliminating cross-talk and color pollution between neighboring sub-pixels. The presence of the spectrum shifting material 506 encompassing the light-emitting surfaces and side surfaces of the micro-LEDs 510 can also help to reduce or eliminate cross-talk and color pollution. In some examples, the walls of the substrate 502 between the pockets 504 can be metallized to reduce or eliminate cross-talk, to improve quantum efficiency by reflecting light that may otherwise have been lost to absorption by the walls, and to improve the directionality of the emitted light.

The micro-LEDs 510 can be assembled into the device 500 using the approaches described above for massively parallel laser-assisted transfer of multiple discrete components. Using these approaches, the micro-LEDs 510 can be assembled quickly, enabling high throughput fabrication. For instance, assembling micro-LEDs into a full HD display using the approaches described above would take less than about ten minutes, such as about 1 minute, about 2 minutes, about 4 minutes, about 6 minutes, about 8 minutes, or about 10 minutes. In contrast, transferring each micro-LED individually to assemble the same display using contemporary conventional approaches would take one or more hours of magnitude longer, such as about 100 hours, about 200 hours, about 400 hours, about 600 hours, or about 800 hours.

In some examples, the approaches described here for concurrent transfer of multiple discrete components can be used for assembly of other devices, such as micro solar cells or microelectromechanical (MEMS) devices. For instance, to assemble components of MEMS mirrors, the pattern of the beamlets of laser energy can be dynamically changed according to the specifications of the mirror. Another example is the heterogeneous integration of system-on-chip (SoC) or system-in-package (SiP) components, where a large number of functional blocks (chiplets) need to be transferred to an interposer substrate where they are aggregated together to form the SoC/SiP component.

A number of embodiments of the invention have been described. Nevertheless, it will be understood that various modifications may be made without departing from the spirit and scope of the invention. For example, some of the steps described above may be order independent, and thus can be performed in an order different from that described.

Other implementations are also within the scope of the following claims.

What is claimed is:

1. An apparatus comprising:
a source of laser energy;
a substrate holder configured to receive a substrate;
an optical system including a first optical element configured to separate a laser beam from the source of laser energy into multiple beamlets, in which the optical system has a first configuration in which the first optical element is disposed in the path of laser energy between the source of laser energy and the substrate holder and at least one additional configuration, the at least one additional configuration being one of (i) a second configuration in which a second optical element is disposed in the path of laser energy and (ii) a third configuration in which neither the first optical element nor the second optical element is in the path of laser energy; and
a controller configured to move the first optical element into and out of the path of laser energy.

2. The apparatus of claim 1, comprising a scanning device configured to scan the laser beam or beamlets output from the optical system relative to the substrate holder.

3. The apparatus of claim 1, comprising a stimulus application device configured to output a stimulus including one or more of ultraviolet light and heat.

4. The apparatus of claim 3, in which, when a substrate is present in the substrate holder, the stimulus application device is positioned to apply the stimulus to the substrate.

5. An apparatus comprising:
a source of laser energy;
a first substrate holder configured to receive at least one first substrate, in which the first substrate holder is configured to hold multiple first substrates;
an optical system including a first optical element configured to separate a laser beam from the source of laser energy into multiple beamlets, in which the optical system has a first configuration in which the first optical element is disposed in the path of laser energy between the source of laser energy and the first substrate holder and
at least one additional configuration, the at least one additional configuration being one of (i) a second configuration in which a second optical element is disposed in the path of laser energy and (ii) a third configuration in which neither the first optical element nor the second optical element is in the path of laser energy;
a first controller configured to control the configuration of the optical system;

a second substrate holder configured to hold at least one second substrate, at least a portion of the second substrate holder being disposed below the first substrate holder; and a second controller configured to control the positioning of the second substrate holder relative to the first substrate holder.

6. The apparatus of claim 5, comprising a scanning device configured to scan the laser beam or beamlets output from the optical system relative to the substrate holder.

7. The apparatus of claim 5, comprising a stimulus application device configured to output a stimulus including one or more of ultraviolet light and heat.

8. The apparatus of claim 5, comprising a control system, the control system including the first controller and the second controller.

9. The apparatus of claim 5, in which the second substrate holder is configured to hold multiple second substrates.

10. The apparatus of claim 5, comprising:
a substrate rack configured to hold multiple second substrates; and
a transfer mechanism controllable by the second controller to transfer one of the multiple second substrates from the substrate rack to the second substrate holder.

11. The apparatus of claim 5, comprising:
a substrate rack configured to hold multiple first substrates; and
a transfer mechanism controllable by a third controller to transfer one of the multiple first substrates from the substrate rack to the first substrate holder.

12. An apparatus comprising:
a source of laser energy;
a substrate holder configured to receive a substrate;
an optical system including a first optical element configured to separate a laser beam from the source of laser energy into multiple beamlets, in which the optical system has a first configuration in which the first optical element is disposed in the path of laser energy between the source of laser energy and the substrate holder and a second configuration in which the first optical element is not in the path of laser energy; and
a controller configured to move the first optical element into and out of the path of laser energy.

13. The apparatus of claim 12, comprising a scanning device configured to scan the laser beam or beamlets output from the optical system relative to the substrate holder.

14. The apparatus of claim 12, comprising a stimulus application device configured to output a stimulus including one or more of ultraviolet light and heat.

15. The apparatus of claim 14, in which, when a substrate is present in the substrate holder, the stimulus application device is positioned to apply the stimulus to the substrate.

16. The apparatus of claim 12, wherein the optical system is configured to be switched between single-component mode in which a single discrete component is individually transferred, and a multiple-component mode in which multiple discrete components are transferred concurrently.

17. The apparatus of claim 16, wherein the single-component mode is configured to transfer one or more undesired discrete components to a destination, wherein the multiple-component mode is configured to then transfer one or more of remaining discrete components to a target substrate.

18. The apparatus of claim 16, wherein the optical system is configured to transfer discrete components that do not satisfy a quality criterion in the single-component mode.

19. The apparatus of claim 16, wherein the optical system is configured to transfer discrete components that do satisfy a quality criterion in the multiple-component mode.

20. The apparatus of claim 12, wherein the first optical element is a diffractive optical element.

* * * * *